(12) United States Patent
Miura et al.

(10) Patent No.: US 11,990,728 B2
(45) Date of Patent: *May 21, 2024

(54) LIGHT EMITTING DEVICE

(71) Applicant: NICHIA CORPORATION, Anan (JP)

(72) Inventors: Soichiro Miura, Tokushima (JP);
Takuya Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 228 days.

This patent is subject to a terminal disclaimer.

(21) Appl. No.: 17/330,241

(22) Filed: May 25, 2021

(65) Prior Publication Data

US 2021/0376561 A1   Dec. 2, 2021

(30) Foreign Application Priority Data

May 26, 2020   (JP) ................. 2020-091388

(51) Int. Cl.
*H01S 5/026* (2006.01)
*F21K 9/235* (2016.01)
*H01L 33/60* (2010.01)
*H01S 5/40* (2006.01)

(52) U.S. Cl.
CPC ........... *H01S 5/0267* (2013.01); *F21K 9/235* (2016.08); *H01S 5/0261* (2013.01); *H01S 5/4031* (2013.01); *H01L 33/60* (2013.01)

(58) Field of Classification Search
CPC .. H01S 5/4093; H01S 5/3013; H01S 5/02257; H01S 5/4031; H01S 5/0261
USPC .................................................. 372/50.121
See application file for complete search history.

(56) References Cited

U.S. PATENT DOCUMENTS

| 5,751,748 A | 5/1998 | Uejima et al. | |
| 5,809,050 A * | 9/1998 | Baldwin | H01S 5/02257 372/50.1 |
| 5,835,514 A * | 11/1998 | Yuen | H01S 5/02257 385/35 |
| 6,252,252 B1 | 6/2001 | Kunii et al. | |
| 6,438,075 B1 * | 8/2002 | Takeda | G11B 7/131 |
| 6,587,481 B1 | 7/2003 | Seong et al. | |

(Continued)

FOREIGN PATENT DOCUMENTS

JP   S60-086887 A   5/1985
JP   H01-123493 A   5/1989

(Continued)

*Primary Examiner* — Tuan N Nguyen
(74) *Attorney, Agent, or Firm* — Foley & Lardner LLP

(57) ABSTRACT

A light emitting device includes: a package having a light extraction face that has a light transmitting region; a first light emitting element disposed in the package and having an emission face configured to emit light that diverges; an optical member disposed in the package, wherein light emitting from the first light emitting element is incident on the optical member, and wherein the optical member is configured to reflect a portion of the incident light and to transmit a remainder of the incident light therethrough; and a photodetector disposed in the package and having a light receiving face configured to receive the light emitted from the first light emitting element and reflected by the optical member. The light emitted from the first light emitting element and transmitted through the optical member exits from the package through the light transmitting region.

20 Claims, 8 Drawing Sheets

(56) References Cited

U.S. PATENT DOCUMENTS

| | | | |
|---|---|---|---|
| 2003/0081637 A1* | 5/2003 | Short | H01S 5/0687 372/18 |
| 2004/0179774 A1 | 9/2004 | Delpiano et al. | |
| 2005/0135219 A1 | 6/2005 | Oka | |
| 2007/0002330 A1* | 1/2007 | Hill | G01B 9/02061 356/498 |
| 2007/0188864 A1* | 8/2007 | Duncan | C08F 289/00 359/489.14 |
| 2011/0116520 A1 | 5/2011 | Krijn et al. | |
| 2011/0280267 A1 | 11/2011 | Yoshikawa et al. | |
| 2015/0229108 A1 | 8/2015 | Steigerwald et al. | |
| 2016/0277116 A1 | 9/2016 | Hasegawa et al. | |
| 2016/0282174 A1 | 9/2016 | Hasegawa et al. | |
| 2017/0207606 A1 | 7/2017 | Nakanishi | |
| 2017/0315368 A1 | 11/2017 | Nakanishi | |
| 2018/0017746 A1 | 1/2018 | Enya et al. | |
| 2019/0334315 A1 | 10/2019 | Enya et al. | |
| 2020/0220323 A1 | 7/2020 | Nakanishi | |
| 2021/0328412 A1 | 10/2021 | Hettler et al. | |

FOREIGN PATENT DOCUMENTS

| | | |
|---|---|---|
| JP | H02-125687 A | 5/1990 |
| JP | H05-175614 A | 7/1993 |
| JP | H07-272337 A | 10/1995 |
| JP | H-08-330661 A | 12/1996 |
| JP | H09-288838 A | 11/1997 |
| JP | 2000-004067 A | 1/2000 |
| JP | 2000-353332 A | 12/2000 |
| JP | 2001-068794 A | 3/2001 |
| JP | 2001-118281 A | 4/2001 |
| JP | 2002-202471 A | 7/2002 |
| JP | 2003-152263 A | 5/2003 |
| JP | 2003-332699 A | 11/2003 |
| JP | 2004-071591 A | 3/2004 |
| JP | 2005-010484 A | 1/2005 |
| JP | 2005-203074 A | 7/2005 |
| JP | 2007-047681 A | 2/2007 |
| JP | 2008-041918 A | 2/2008 |
| JP | 2009-244594 A | 10/2009 |
| JP | 2011-527518 A | 10/2011 |
| JP | 2011-249714 A | 12/2011 |
| JP | 2012-018992 A | 1/2012 |
| JP | 2012-163903 A | 8/2012 |
| JP | 2016-015415 A | 1/2016 |
| JP | 2016-096219 A | 5/2016 |
| JP | 2016-178218 A | 10/2016 |
| JP | 2016-181645 A | 10/2016 |
| JP | 2017-506824 A | 3/2017 |
| JP | 2018-010944 A | 1/2018 |
| JP | 2018-014351 A | 1/2018 |
| JP | 2018-022840 A | 2/2018 |
| JP | 2018-085422 A | 5/2018 |
| JP | 2018-085450 A | 5/2018 |
| JP | 2018-098256 A | 6/2018 |
| JP | 2020-016826 A | 1/2020 |
| JP | 2021-174991 A | 11/2021 |
| WO | WO-2010/004477 A2 | 1/2010 |
| WO | WO-2016/076105 A1 | 5/2016 |
| WO | WO-2018/105182 A1 | 6/2018 |
| WO | WO-2019/065162 A1 | 4/2019 |

* cited by examiner $P12 - (R1 + R2) \geqq 0$ $P12 - (L1 \cdot \tan \theta1 + L2 \cdot \tan \theta2) \geqq 0$

LIGHT EMITTING DEVICE

CROSS-REFERENCE TO RELATED APPLICATION

This application claims priority to Japanese Patent Application No. 2020-091388, filed on May 26, 2020, the disclosure of which is hereby incorporated by reference in its entirety.

BACKGROUND

The present disclosure relates to a light emitting device.

Light emitting devices having a package in which multiple constituent elements are disposed have been available. Examples of the constituent elements include, for example, light emitting elements. Examples other than light emitting elements include Zener diodes, thermistors, photodiodes and the like.

For example, PCT Publication No. WO2010/004477A2 discloses a light source for a lighting application provided with two photodiodes that monitor a portion of the laser light condensed onto a phosphor material and a portion of the fluorescent light emitted by the phosphor material.

Performance enhancement and multifunctionality are achieved for a light emitting device package having a configuration in which such multiple constituent elements are mounted. On the other hand, there is a need to further reduce the size of such a light emitting device or a unit incorporating such a device.

SUMMARY

One of the objects of the present disclosure is to achieve size reduction of a light emitting device equipped with a light emitting element and a photodetector.

A light emitting device according to one embodiment of the present disclosure includes: a package having a light extraction face that has a light transmitting region, a first light emitting element disposed in the package and having an emission face emitting light that diverges, an optical member disposed in the package, the optical member on which the light emitted from the first light emitting element becomes incident and reflects a portion of the incident light while transmitting a remainder of the incident light, and a photodetector disposed in the package and having a light receiving face that receives the light emitted from the first light emitting element and reflected by the optical member. The light emitted from the first light emitting element and transmitted through the optical member exits from the package through the light transmitting region.

A light emitting device according to another embodiment of the present disclosure includes: a first light emitting element having a first emission face from which a first light is emitted in a first direction, a second light emitting element having a second emission face from which a second light is emitted in the first direction, an optical member reflecting a portion of the first light and transmitting a remainder of the first light, while reflecting a portion of the second light and transmitting a remainder of the second light, and a photodetector receiving the first light and the second light reflecting off the optical member. An optical path length of the first light from the first emission face until the light reaches the photodetector, and an optical length of the second light from the second emission face until the second light reaches the photodetector are each 1.5 mm at most.

A light emitting device according to the present disclosure can achieve size reduction of the light emitting device.

DETAILED DESCRIPTION

Figure 1:
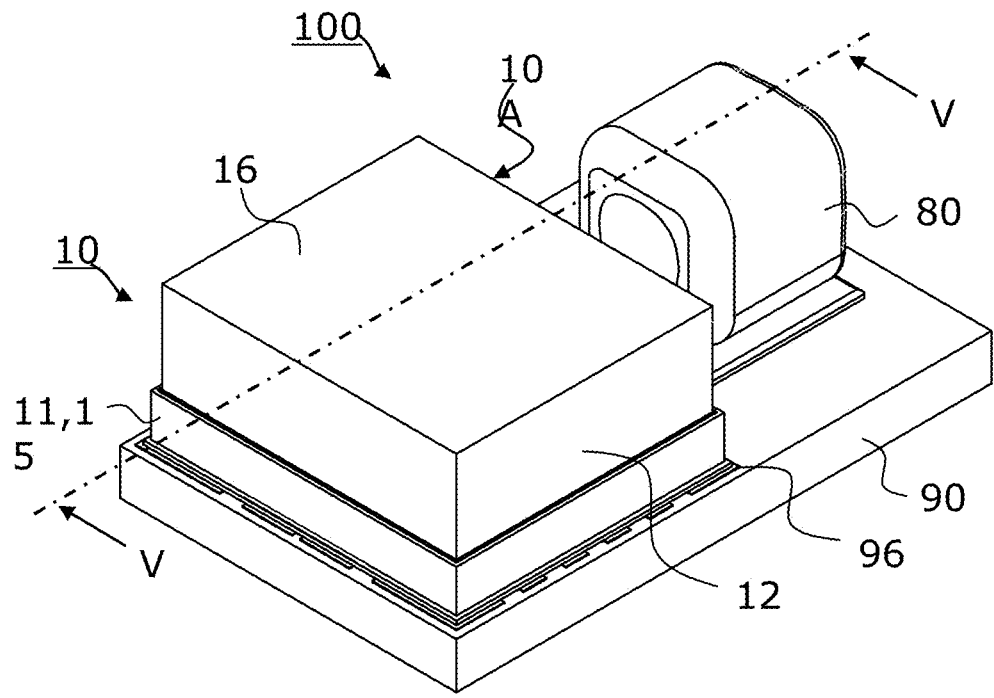
FIG. 1 is a perspective view of a light emitting device according to a first embodiment of the present disclosure.

In the specification and claims herein, a polygonal shape, such as a triangle, quadrangle, or the like, is not limited to the polygonal shape in a mathematically strict sense, and includes any of those shapes subjected to processing such as cutting angles, chamfering, beveling, rounding, or the like. Similarly, a polygonal shape subjected to processing not only at a corner (end of a side), but also in the middle of a side will also be referred to as a polygonal shape. In other words, any polygon-based shape subjected to processing is included in a "polygon" disclosed in the specification and the claims herein.

This applies to not only polygons, but also any word that describes a specific shape, such as a trapezoidal, circular, recessed, or projected shape. This also applies when describing each side of a shape. In other words, even if a side is subjected to processing at a corner or in the middle, the "side" includes the processed portion. In the case of distinguishing a "polygon" or "side" that has not been processed from a processed shape, it will be expressed with the word "strict sense" added thereto, for example, a "strict sense quadrangle."

In the specification and claims herein, moreover, when there are multiple pieces of a certain component and a distinction must be made, an ordinal such as "first," "second," or the like might occasionally be added. For example, a claim may recite that "a light emitting element is disposed on a substrate," while the specification may state that "a first light emitting element and a second light emitting element are disposed on a substrate." The ordinals, such as "first" and "second," are merely used to distinguish two light emitting elements. There is no special meaning associated with the order of the ordinals. An element accompanied by the same ordinal might not refer to the same element between the specification and the claims. For example, in the case in which elements are specified by the words, "a first light emitting element," "a second light emitting element," and "a third light emitting element," in the specification, "a first light emitting element" and "a second light emitting element" recited in the claims might correspond to "a first light emitting element" and "a third light emitting element" in the specification. Furthermore, in the case in which the term, "a first light emitting element," is used, but the term, "a second light emitting element," is not used in claim 1, the invention according to claim 1 is sufficient if it includes one light emitting element, and the light emitting element is not limited to "a first light emitting element" as used in the specification, i.e., it can be "a second light emitting element" or "a third light emitting element" in the specification.

In the specification and claims herein, terms indicating directions or positions (e.g., "upper/upward," "lower/downward," "right/rightward," "left/leftward" and other terms including these) might be used. These terms, however, are merely used for the purpose of making the relative directions or positions in the drawings being referenced more easily understood. As long as the relative relationship between the directions or the positions indicated with the terms such as "upper," "lower," or the like is the same as those in a referenced drawing, the absolute layout of the elements in drawings outside of the present disclosure, or actual products and manufacturing equipment outside of the present disclosure, does not have to be the same as that shown in the referenced drawing.

The sizes, size ratios, shapes, spacing and the like of the constituent elements shown in the drawings might be exaggerated for clarity of explanation. Certain elements might be omitted in a drawing so as not to make the drawing excessively complex.

Certain embodiments of the present invention will be explained below with reference to the accompanying drawings. The embodiments described below give shape to the technical ideas of the present invention, but do not limit the present invention. The numerical values, shapes, materials, steps, and the sequence of the steps described in the embodiments described below are merely examples, and are modifiable in various ways to the extent that such a modification does not cause technical inconsistencies. In the explanation below, the same designations and reference numerals denote the same or similar elements, for which a redundant explanation will be omitted as appropriate.

First Embodiment

Figure 2:
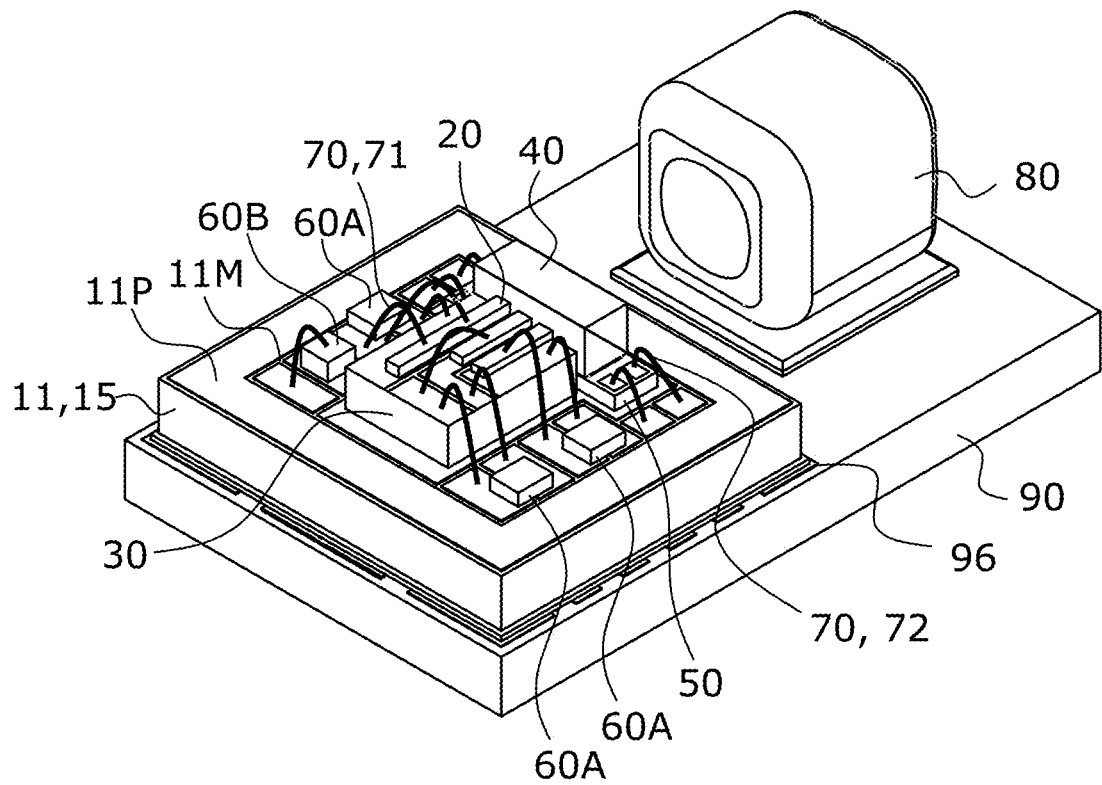
FIG. 2 is a perspective view of the light emitting device according to the first embodiment without showing the cap.
Figure 3:
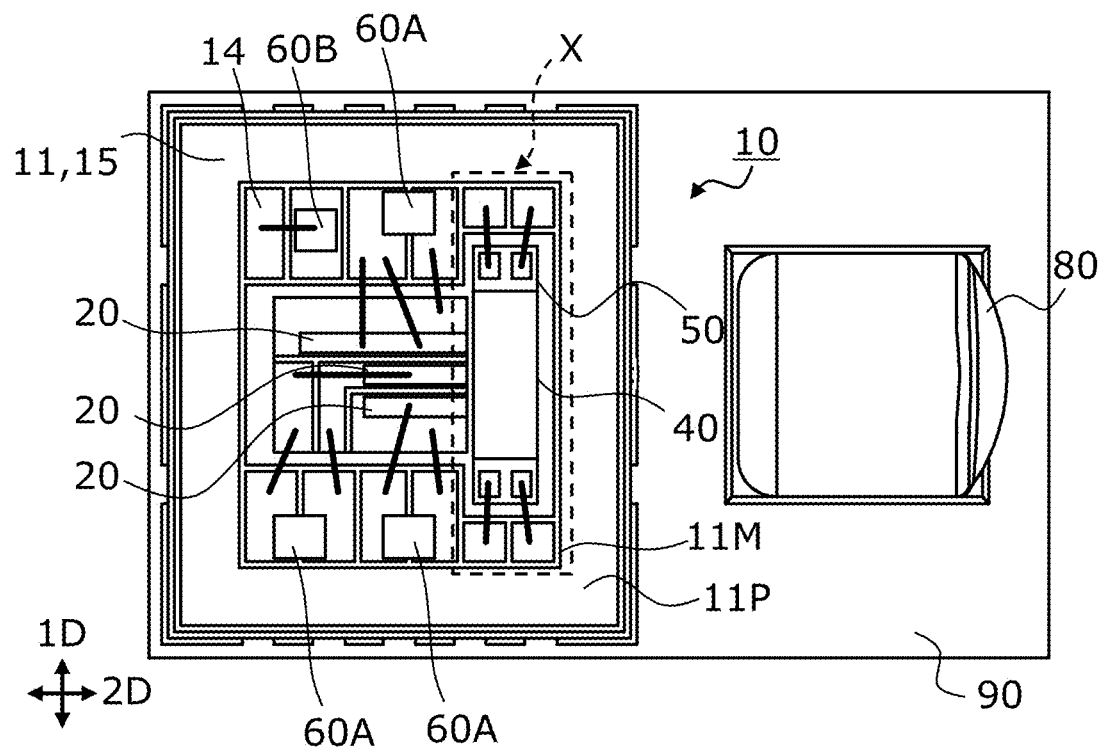
FIG. 3 is a top view of the light emitting device according to the first embodiment without showing the cap.
Figure 4:
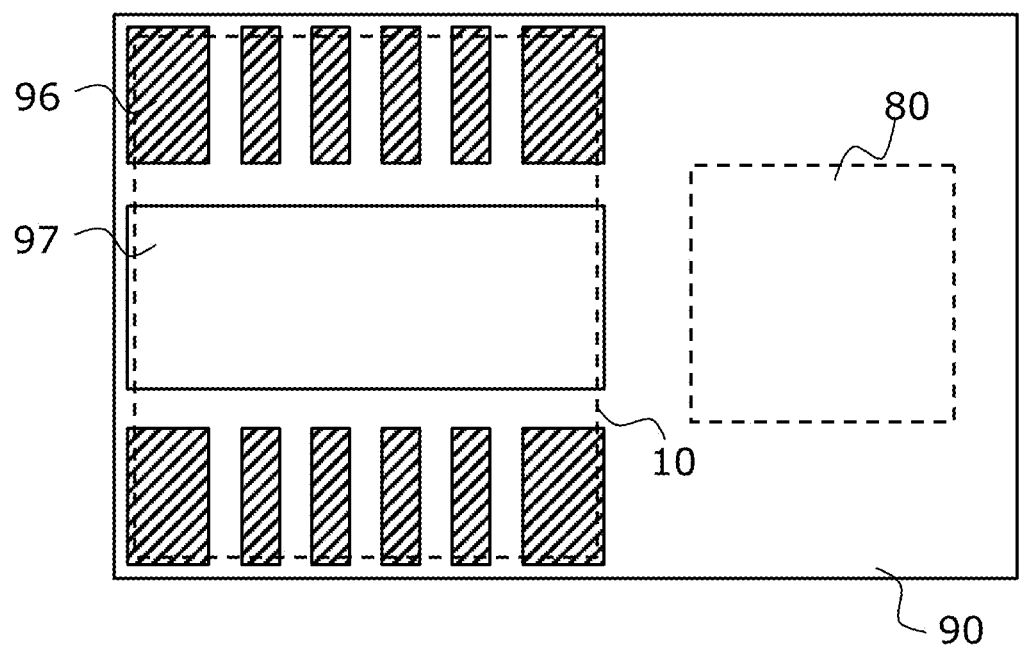
FIG. 4 is a top view of the light emitting device according to the first embodiment without showing the package and the lens member.
Figure 5:
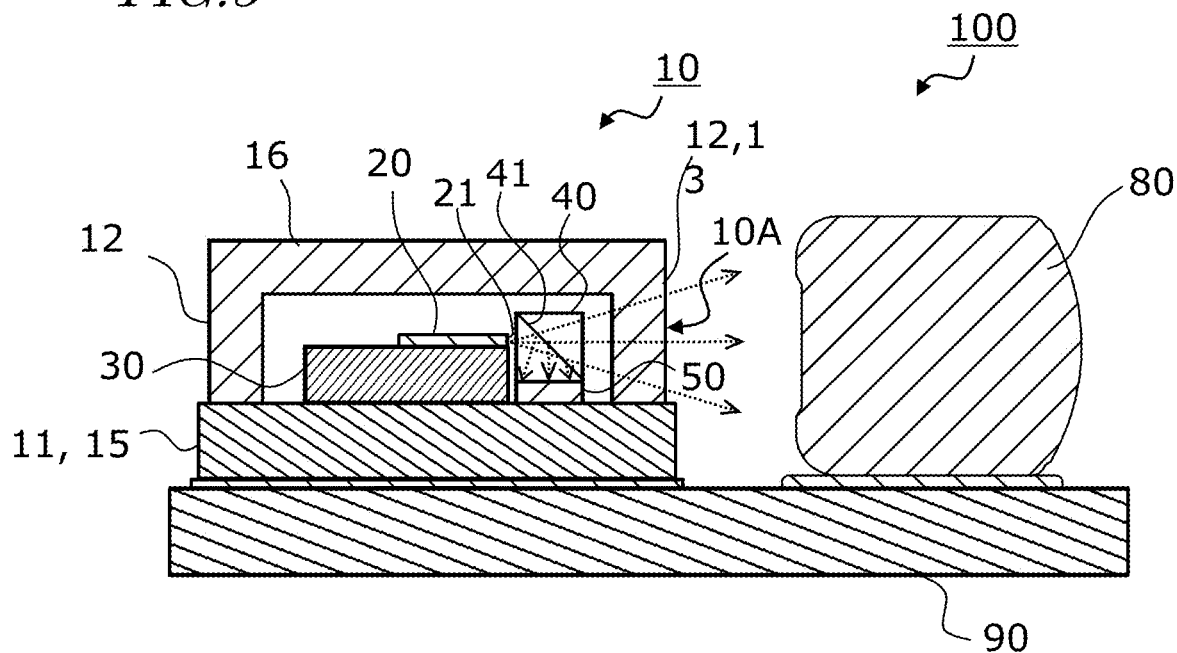
FIG. 5 is a cross-sectional view of the light emitting device taken along line V-V in FIG. 1.
Figure 6:
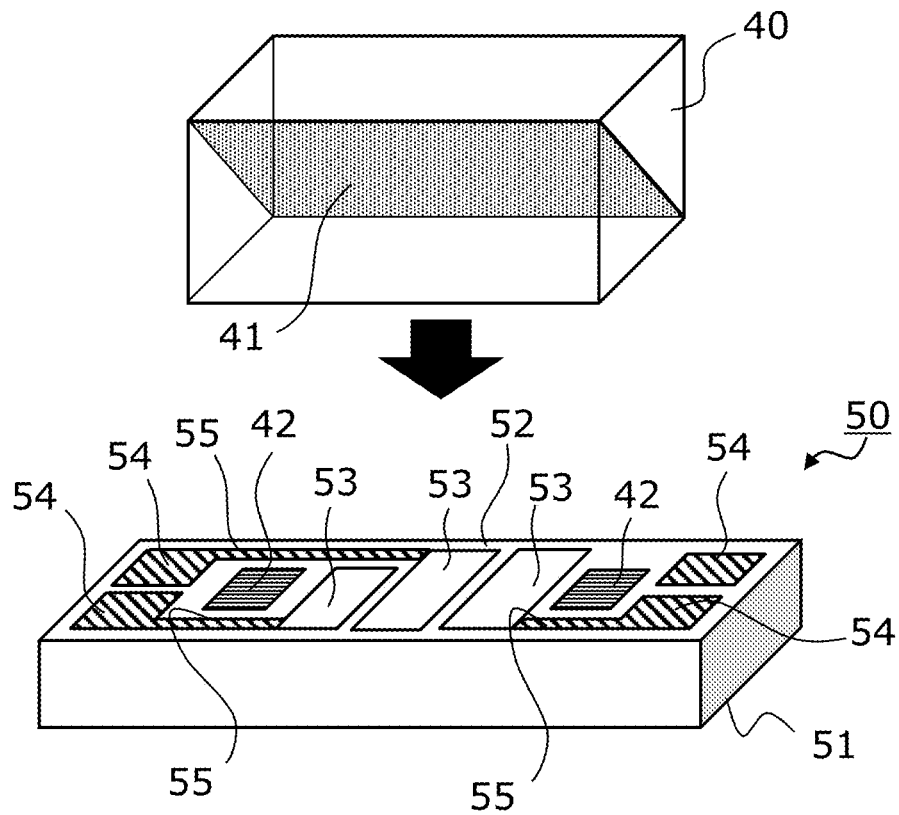
FIG. 6 is a perspective view of the photodetector and the optical member according to the first embodiment.
Figure 7:
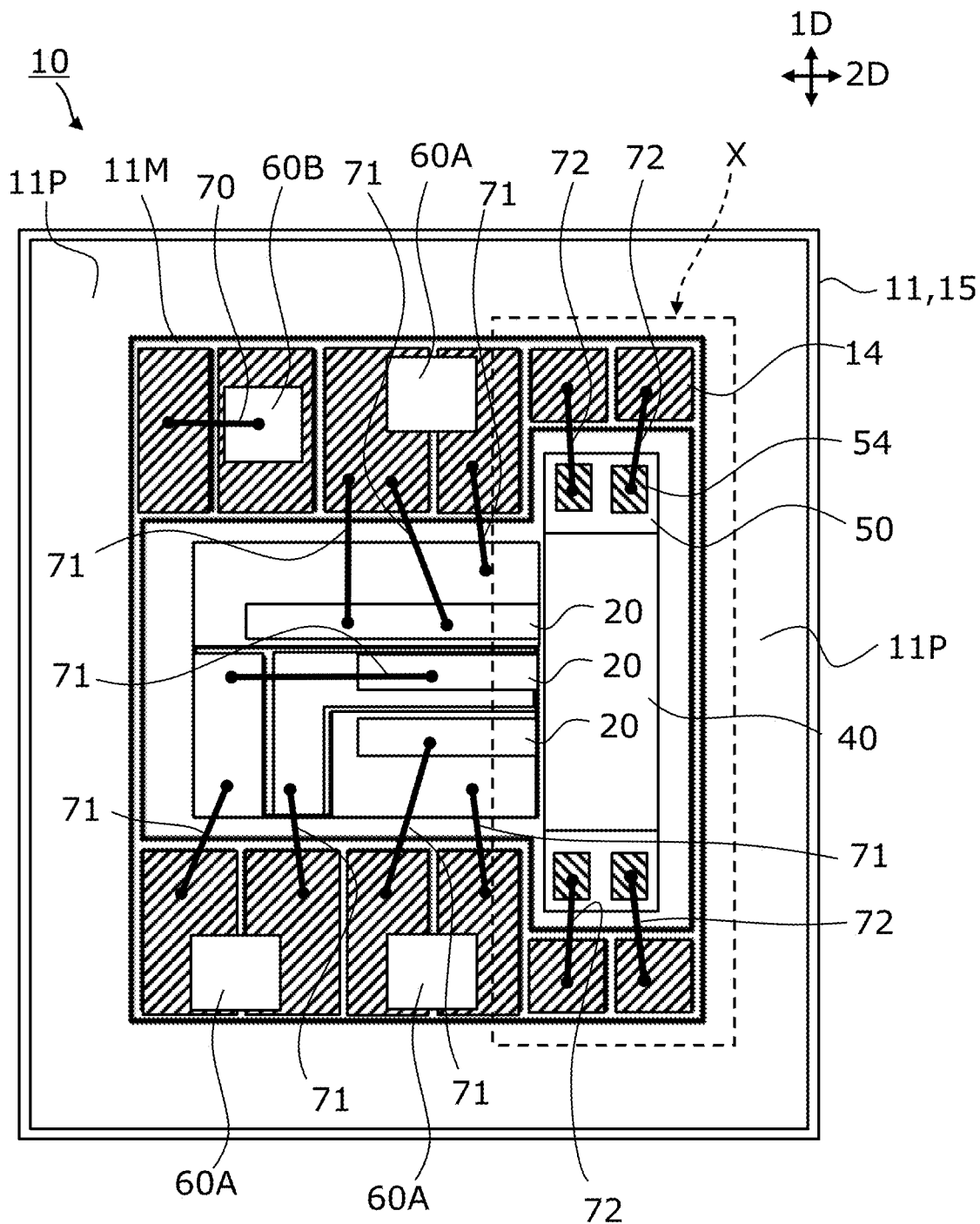
FIG. 7 is an enlarged top view of the in of the package according to the first embodiment.
Figure 8:
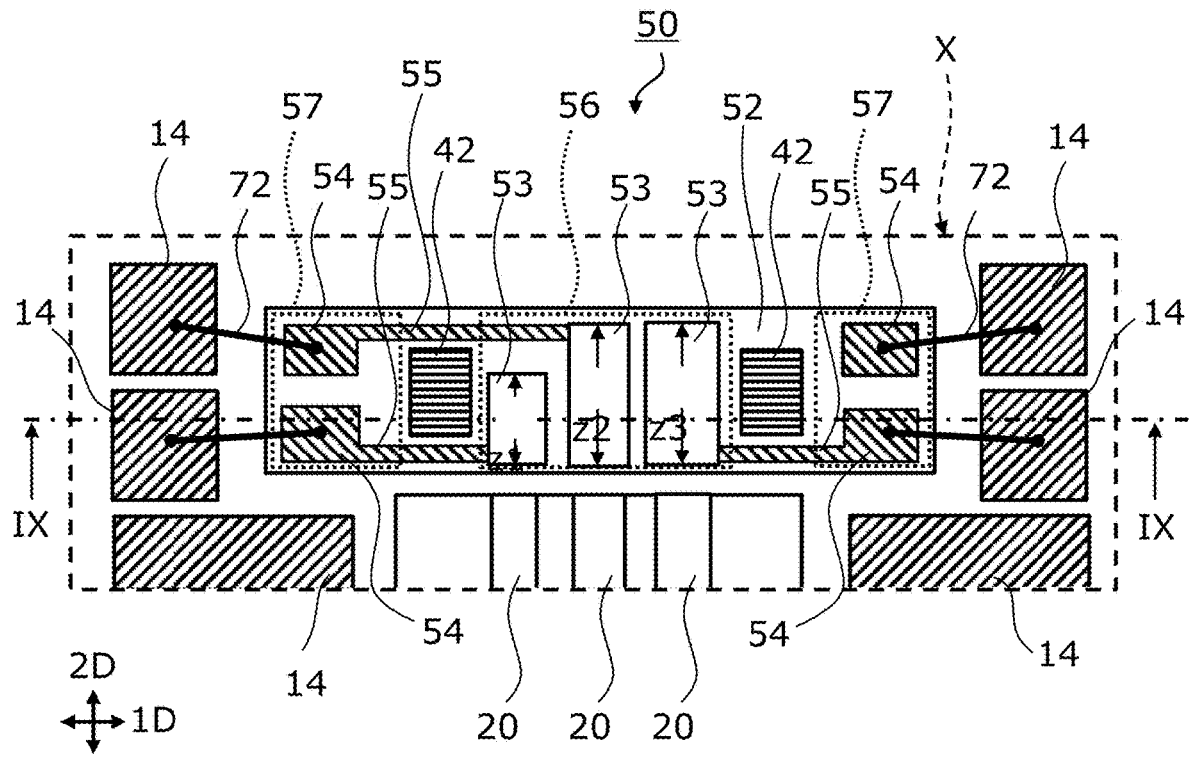
FIG. 8 is an enlarged view of the portion X in the top views in FIG. 3 and FIG. 7 without showing the optical member 40.
Figure 9:
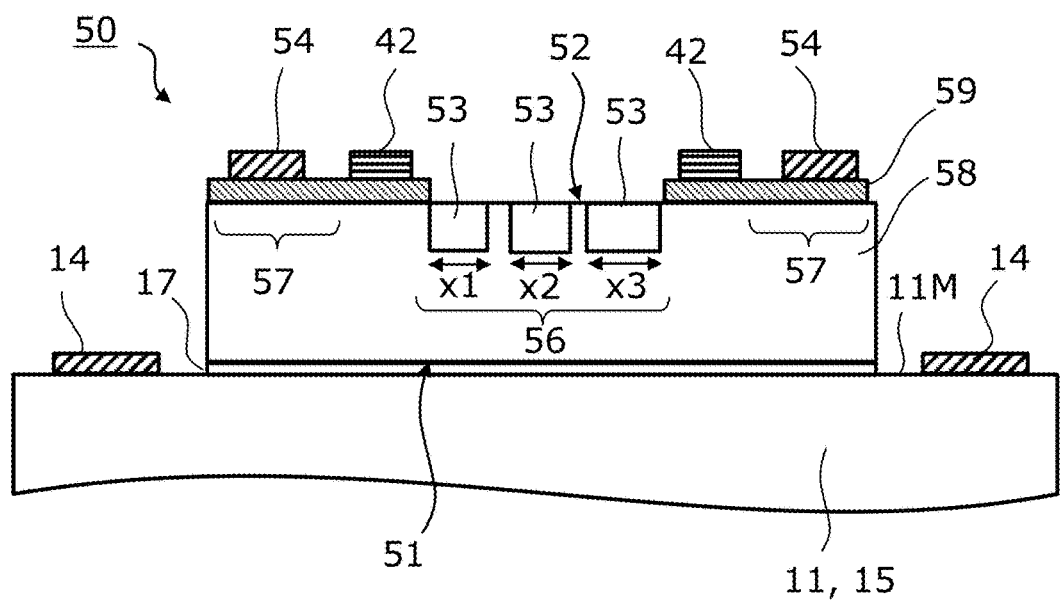
FIG. 9 is a cross-sectional view of the photodetector and the surrounding region thereof taken along line IX-IX in FIG. 8.
Figure 10:
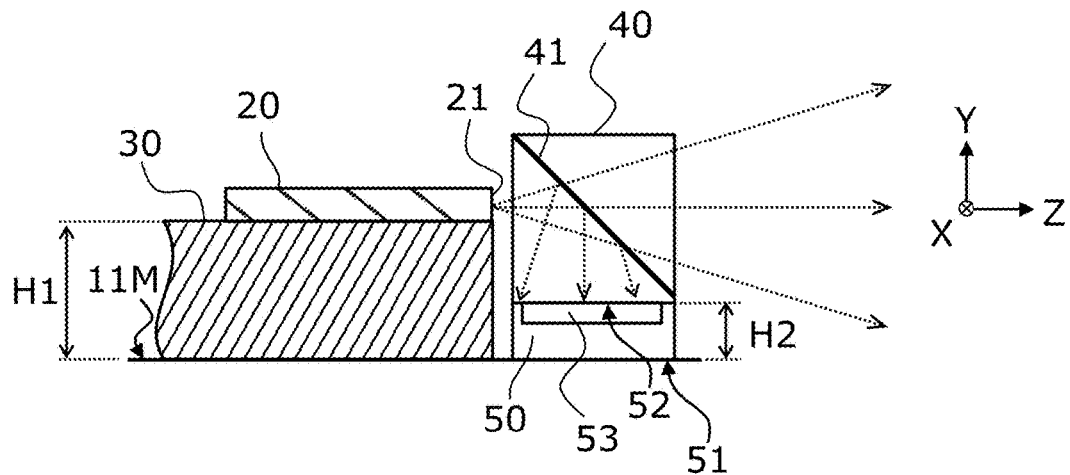
FIG. 10 is a schematic diagram showing how the light from a light emitting element diverges.
Figure 11:
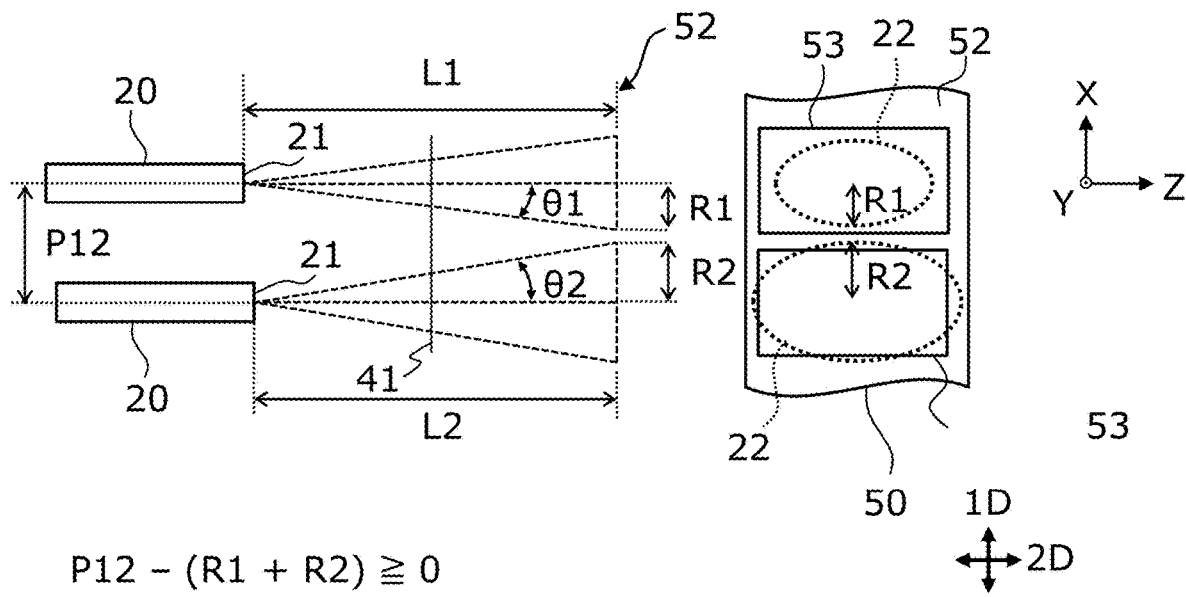
FIG. 11 is a schematic diagram showing the relationships between the divergence half angles of the light from two adjacent light emitting elements and the distances from the light emitting elements to the light receiving face.

A light emitting device 100 according to a first embodiment will be explained. FIG. 1 to FIG. 11 are drawings for explaining an exemplary form of the light emitting device 100. FIG. 1 is a perspective view of the light emitting device 100 according to the embodiment. FIG. 2 is a perspective view of the light emitting device 100 without showing the cap 16 of the package 10. FIG. 3 is a top view in the same state as in FIG. 2. FIG. 4 is a top view of the light emitting device 100 without showing the package 10 and the lens member 80. FIG. 5 is a cross-sectional view taken along line V-V in FIG. 1. FIG. 6 is a perspective view of the photodetector 50 and the optical member 40. FIG. 7 is an enlarged top view of the inside of the package 10. FIG. 8 is a diagram enlarging the portion X in the top views in FIG. 3 and FIG. 7 for explaining the photodetector 50. The optical member 40 is omitted in FIG. 8 in order to make the photodetector 50 visible. FIG. 9 is a cross-sectional view of the photodetector 50 and the surrounding region thereof taken along line IX-IX in FIG. 8. FIG. 10 is a diagram schematically showing how the light emitted from the light emitting element 20 advances. FIG. 11 is a diagram schematically showing the relationships among the divergence half angles θ1, θ2, the optical path lengths L1, L2 from the light emitting elements 20 (having a gap P12 therebetween) to the light receiving face 52, and the sizes of the irradiated regions 22 on the light receiving face 52 of the photodetector 50.

The light emitting device 100 according to this embodiment has constituent elements including a package 10, one or more light emitting elements 20, a submount 30, an optical member 40, a photodetector 50, a protective device 60A, a temperature measuring element 60B, wires 70, a lens member 80, and a substrate 90.

In the example of a light emitting device 100 illustrated in the drawings, three light emitting elements 20, a submount 30, an optical member 40, a photodetector 50, protective devices 60A, a temperature measuring element 60B, and wires 70 (71, 72) are arranged in the space in a package 10. The divergent light from the three light emitting elements 20 is collimated by the lens member 80 after exiting the package 10. A portion of the divergent light emitted from each of the three light emitting elements 20 irradiates the photodetector 50. The photodetector 50 provides output signals in correspondence with the intensity of the divergent light received, which can be utilized to monitor the intensity of the light emitted from the light emitting device 100.

Each constituent element will be explained.

Package 10

A package 10 includes a base 11, which has a mounting face 11M, and a wall part 12 surrounding the mounting face 11M. The mounting face 11M of the base 11 is the area where other constituent elements are arranged. The package 10 further includes a substrate 15 and a cap 16 fixed to the substrate 15. The substrate 15 includes the base 11, and the cap 16 has the wall part 12. For the purpose of distinguishing the substrate 15 from the substrate 90, they may be referred to as the first substrate 15 and the second substrate 90, respectively, below.

In the example shown in the drawings, the cap 16 includes an upper face part (lid portion) and a lateral face part (frame portion). The upper face of the cap 16 faces the mounting face 11M with the other constituent elements disposed on the mounting face 11M interposed therebetween. The lateral face part of the cap 16 surrounds the other constituent elements disposed on the mounting face 11M. The lateral face part of the cap 16 may include the wall part 12. The wall part 12 does not have to be configured as a part of the cap 16. For example, the package 10 can be replaced with a package configured as a member integrating a base 11 and a wall part 12, and another member having an upper face part.

In the top view, the outlines of the base 11 and the cap 16 are quadrilateral-shaped. The outline of either member is not limited to a quadrilateral shape, and can be another polygonal shape, or a shape that includes a curved line, bent line, depression, or protrusion in part or whole.

The base 11 has one or more upper faces. The one or more upper faces of the base 11 include the mounting face 11M. The one or more upper faces of the base 11 include the surrounding region 11P that surrounds the mounting face 11M. In the light emitting device 100 illustrated in the drawings, the mounting face 11M and the surrounding region 11P are coplanar with each other. The mounting face 11M and the surrounding region 11P do not have to be coplanar, and the mounting face 11M and the surrounding region 11P can be located on the upper faces having different heights.

The surrounding region 11P is where the cap 16 is joined. The surrounding region 11P is located between the outline of the base 11 and the outline of the mounting face 11M in a top view. In the light emitting device 100 illustrated in the drawings, the outline of the mounting face 11M is quadrilateral-shaped, and the surrounding region 11P is provided along the four sides of the quadrilateral shape of the mounting face 11M in the top view. The lower face of the lateral face part of the cap 16 is joined to the upper face of the surrounding region 11P. A metal film for bonding to the cap 16 can be disposed on the surrounding region 11P.

As shown in FIG. 5, the package 10 has a light transmitting region 13, which is a region having light transmissivity. The package 10 has a light extraction face 10A that includes the light transmitting region 13. The light extraction face 10A is included in one of the one or more outer lateral faces of the wall part 12 of the package 10. Having light transmissivity means a property of transmitting at least 80% in relation to the main light incident on the region. For example, in the case in which the main wavelength range of light is infrared light, if the transmittance relative to infrared light is at least 80%, the member can be said to have light transmissivity.

The package 10 can have light transmissivity in a region other than the light transmitting region 13 in the one or more outer lateral faces. The package 10 can have a non-light transmitting region (region having no light transmissivity) in part. It is unnecessary for the entire wall part 12 of the package 10 to have light transmissivity. In the example illustrated in the drawings, the package 10 has four outer lateral faces corresponding to the quadrilateral shape, and all of the four faces have light transmissivity, but only one face is the light extraction face 10A.

The cap 16 can be formed of a light transmissive material in its entirety, or only the lateral face part can be formed of a light transmissive material. A portion of the cap that includes the light extraction face 10A can be formed of a first light transmissive material and the other portion can be formed of a second light transmissive material or non-light transmissive material.

The cap 16 can be formed by integrating the upper face part and the lateral face part. For example, using a light transmissive material, such as glass, plastic, or quartz, the cap 16 having a desired shape such as a box shape can be produced by utilizing a processing technique, such as forming or etching. The cap 16 can be formed by bonding an upper face part (lid portion) and a lateral face part (frame portion) separately formed using materials as primary materials different from each other. For example, the upper face part can be formed of a monocrystalline or polycrystalline silicon as a primary material, and the lateral face part can be formed of glass as a primary material. The cap 16 can have, for example, a height of 2.5 mm at most, and in the top view, a length of a side of the outline of the quadrilateral shape of 8 mm at most. Moreover, for example, the height can be 2 mm at most, and in the top view, the length of a side can be 4 mm at most.

In the light emitting device 100 illustrated in the drawings, the light extraction face 10A is perpendicular to the direction in which the mounting face 11M extends (lateral direction). Perpendicular here includes tolerances of up to ±5 degrees. The light extraction face 10A does not need to be perpendicular to the direction in which the mounting face 11M of the base 11 extends (lateral direction), and can be oblique thereto.

A plurality of wiring regions 14 are provided on the mounting face 11M. In FIG. 7, instead of marking all of the wiring regions with reference numerals, the same hatching lines are applied to the wiring regions 14. The wiring regions 14 can go through the base 11 and be electrically connected to the wiring regions provided on the lower face of the base 11. The wiring regions to be electrically connected to the wiring regions 14 can be provided not only on the lower face of the base 11, but also on other outer surfaces of the base 11 (upper face or outer lateral faces). The wiring regions 14, formed of a conductive material such as metal, can be a patterned film, layer, or vias.

The first substrate 15 can be formed using a ceramic as a primary material. Examples of ceramics used for the first substrate 15 include aluminum nitride, silicon nitride, aluminum oxide, silicon carbide, and the like.

In this embodiment, the first substrate 15 can be formed by using a ceramic substrate having multiple metal vias. The first substrate 15 preferably includes a higher heat-dissipating material (higher thermal conductivity material) than ceramics in the portions that are in thermal contact with heat generating constituent elements. Examples of such materials can include copper, aluminum, iron, copper molybdenum, copper tungsten, and copper-diamond composite materials.

Light Emitting Element 20

An example of a light emitting element 20 is a semiconductor laser element. The light emitting element 20 can have a rectangular outline in the top view. In the case of an edge-emitting semiconductor laser element, the lateral face that intersects with one of the short sides of the rectangle in the top view is the emission face (emission face 21). In this example, the upper face and the lower face of the light emitting element 20 each have a larger area than the emission face 21. The light emitting element 20 is not limited to an edge-emitting semiconductor laser element, and can be a surface-emitting semiconductor laser element or light emitting diode (LED).

The light emitting element 20 is a single emitter having one emitter. The light emitting element 20 can be a multi-emitter having two or more emitters. In the case in which the light emitting element 20 is a semiconductor laser element having two emitters, one common electrode can be disposed on the upper face or the lower face of the light emitting element 20, while disposing two electrodes corresponding to the emitters on the other face.

The light emitted from the emission face 21 of a light emitting element 20 is divergent light. It is not limited to divergent light. In the case in which the light emitting element 20 is a semiconductor laser element, the divergent light (laser light) from the semiconductor laser element forms an elliptical far field pattern (hereinafter referred to as "FFP") in a plane parallel to the emission face. Here, FFP represents the shape and light intensity distribution of the emitted light at a location distant from the emission face.

The light passing the center of an elliptical FFP, in other words, the light having the peak intensity in the FFP light intensity distribution, will be referred to as the light advancing along the optical axis. The optical path of the light advancing along the optical axis will be referred to as the optical axis of that light. The light having an intensity of at least $1/e^2$ relative to the peak intensity value in the FFP light intensity distribution will be referred to as the "main portion" of the light.

In an elliptical FFP of the light emitted from a light emitting element 20, which is a semiconductor laser element, the shorter diameter direction and the longer diameter direction of the ellipse will be referred to as the horizontal direction of the FFP and the vertical direction of the FFP, respectively. The multiple layers, including an active layer, configuring a semiconductor laser element are stacked in the vertical direction of the FFP.

Based on the light intensity distribution of an FFP, the angle corresponding to the full width at half maximum of the light intensity distribution will be referred to as divergence angle of the light from the semiconductor laser element. The divergence angle in the vertical direction of an FFP will be referred to as vertical divergence angle, and the divergence angle in the horizontal direction of an FFP will be referred to as horizontal divergence angle.

For a light emitting element 20, for example, a blue light emitting semiconductor laser element, green light emitting semiconductor laser element, or red light emitting semiconductor laser element can be employed. A semiconductor laser element that emits light of a color other than these can be employed.

Here, blue light refers to light having a peak emission wavelength in the 420 nm to 494 nm range. Green light refers to light having a peak emission wavelength in the 495 nm to 570 nm range. Red light refers to light having a peak emission wavelength in the 605 nm to 750 nm range.

Examples of blue or green light emitting semiconductor laser elements include semiconductor laser elements including nitride semiconductors. For nitride semiconductors, for example, GaN, InGaN, and AlGaN can be used. Examples of red light emitting semiconductor laser elements include those including InAlGaP based, GaInP based, GaAs based, and AlGaAs based semiconductors.

Submount 30

A submount 30 has two bonding faces, and is shaped as a rectangular cuboid. One bonding face is located opposite the other bonding face. The distance between the two bonding faces is smaller than the distance between the other two opposing faces. The shape of the submount 30 is not limited to a rectangular cuboid. The submount 30 can be formed by using, for example, silicon nitride, aluminum nitride, or silicon carbide. A metal film is formed on the bonding faces for bonding purposes.

Optical Member 40

An optical member 40 has a partially reflecting face 41 (FIGS. 5 and 6). The "partially" in the term, "partially reflecting face" means that a portion of the incident light is reflected (partial reflection), instead of all light being reflected. The partially reflecting face 41 reflects a portion of the incident light, and transmits the remainder of the light. Moreover, the direction of travel of the light reflected by the partially reflecting face 41 is oblique to the direction antiparallel relative to the direction of travel of the incident light. In other words, the partially reflecting face 41 functions as a beam splitter.

The light incident on the partially reflecting face 41 is split into two that advance in different directions. The two split portions of light contain light of the same wavelengths. The optical member 40 splits the wavelength components of the incident light into two predetermined percentages.

With respect to the two portions of light split by the optical member 40, for example, one can be utilized as a main portion of light (main portion of light), and the other as a monitoring portion of light for the purpose of controlling the main portion of light (monitoring portion of light). Moreover, for example, both portions of light can be utilized as main portions of light.

In the case of splitting the incident light into a main portion of light and a monitoring portion of light, the intensity of the monitoring portion of light is lower than the intensity of the main portion of light. The partially reflecting face 41, for example, transmits at least 80% of the incident light to be utilized as a main portion of light, while reflecting up to 20% of the incident light to be utilized as a monitoring portion of light. The intensity of the monitoring portion of light can be set as 5% to 10% of the intensity of the main portion of light. The intensity of the monitoring portion of light can be, for example, about 5% or lower.

The partially reflecting face 41 can have a reflectance relative to visible light in the range of 0.5% to 20.0%, for example. The reflectance can be in the 2.0% to 10.0% range. Furthermore, the reflectance of the partially reflecting face 41 can be varied in response to the wavelength of the incident light. Accordingly, in the case in which portions of light of different colors become incident on one partially reflecting face 41, the reflectance can be made different depending on the color. It is unnecessary to make the reflectance equal for light of all colors. The reflectance can be suitably designed for the light to be reflected by the partially reflecting face 41.

In the case in which light of different colors become incident, for example, the partially reflecting face 41 can have reflecting regions provided per color of light becoming incident and having a matching reflectance. The multiple reflecting regions corresponding to the incident regions can be separated from one another or partially overlapped.

The partially reflecting face 41 is oblique to the lower face (horizontal face) of the optical member 40. The partially reflecting face 41 is a flat face forming an oblique angle of in a range of 40° to 50° with the lower face of the optical member 40, for example. In the light emitting device 100 illustrated in the drawings, the partially reflecting face 41 is a flat face forming an oblique angle of 45° with the lower face of the optical member. The oblique angle can be in the range of 10° to 80°.

The optical member 40 can be constructed by bonding two prisms (transparent triangular prisms) with a metal thin film interposed therebetween. The metal thin film functions as the partially reflecting face 41. The reflectance can be controlled by adjusting the type and the thickness of the metal thin film. A dielectric multilayer film can be used in place of the metal thin film. The optical member 40 can employ a single prism on which a metal thin film or dielectric multilayer film is deposited on an inclined surface, instead of employing two prisms. The optical member 40 can reflect a portion of the incident light simply by utilizing Fresnel reflection occurring at the interface between the air and the dielectric.

The optical member 40 is formed as a rectangular cuboid. The shape of the optical member 40 is not limited to a rectangular cuboid. The optical member 40 has an upper face parallel to the lower face. One part of the optical member 40 preferably includes a bonding face in order to fix the optical member 40 to another member. For example, the lower face of the optical member 40 can function as a bonding face against the member positioned thereunder. One or both of a pair of lateral faces of the optical member 40 can function as the bonding face(s). The upper face of the optical member 40 can function as the bonding face against another member.

Photodetector 50

A photodetector 50 has a bonding face 51 and a light receiving face 52. The bonding face 51 is located opposite the light receiving face 52. The photodetector 50 has an upper face, a lower face, and one or more lateral faces. The upper face of the photodetector 50 serves as the light receiving face 52. The outer shape of the photodetector 50 is a rectangular cuboid. It can have an outer shape different from a rectangular cuboid.

The light receiving face 52 is provided with one or more light receiving regions 53. Each of the one or more light receiving regions 53 is a photoelectric conversion element that outputs an electrical signal in correspondence with the intensity or the amount of incident light. A typical example of such a photoelectric conversion element is a photodiode. Individual photodiodes can be formed, for example, by doping predetermined regions of an n-type Si substrate with p-type impurity ions. In this case, a light receiving region 53 is defined by the p-type impurity region doped with p-type impurity ions. In the example of a photodetector 50 illustrated in FIG. 9, a plurality of p-type impurity regions are formed at predetermined positions in contact with the upper face (the light receiving face 52) of an n-type semiconductor substrate 58, and each p-type impurity region functions as a light receiving region 53. The n-type semiconductor substrate 58 can include an epitaxial layer at the surface. A p-n junction is formed at the boundary between each p-type impurity region and the n-type impurity region to function as a diode. The electrical potential of a p-type impurity region (light receiving region 53) is defined by the electrical potential of the anode electrode electrically connected to the p-type impurity region, and the electrical potential of the n-type impurity region (n-type Si substrate) is defined by the cathode electrode electrically connected to the n-type impurity region. When light enters the individual light receiving regions 53 in the state in which a reverse biased voltage is applied to the p-n junctions, electron-hole pairs are generated to allow a current to flow between each anode electrode and the cathode electrode common to all light receiving regions 53. Based on the current, the intensity or the amount of light incident on the individual light receiving regions 53 can be obtained. The p-type and n-type conductivity can be reversed, and the type of semiconductor is not limited to Si.

In the case of the photodetector 50 illustrated in the drawings, the light receiving face 52 of the photodetector 50 is provided with three light receiving regions 53. The number of light receiving regions 53 is not limited to three. The light receiving regions 53 are lined up at certain intervals. Here, the direction in which the light receiving regions 53 are lined up will be referred to as "first direction." The direction perpendicular to the first direction in the top view will be referred to as "second direction." The arrows 1D and 2D in FIG. 7 and FIG. 8 respectively indicate the "first direction" and the "second direction," in the photodetector 50 illustrated in the drawings.

The light receiving face 52 has a quadrilateral outline. The length of the light receiving face 52 in the first direction is larger than the length in the second direction. The length of the light receiving face of the photodetector 50 in the first direction can be the same as the length in the second direction. The length in the second direction can be larger than the length in the first direction. In the light emitting device 100 illustrated in the drawings, the shape having a larger length in the first direction than the length in the second direction contributes to size reduction of the light emitting device 100.

The light receiving regions 53 are lined up at certain intervals. In other words, the light receiving regions 53 are spaced apart from one another and do not overlap. They do not need to be lined up at equal intervals. The light receiving regions 53 are lined up so as to be close to one another. The distance between adjacent light receiving regions 53 can be smaller than the width of at least one of the adjacent light receiving regions 53 in the first direction (X1, X2, or X3). Moreover, the distance between adjacent light receiving regions 53 can be smaller than the width of any of the adjacent light receiving regions 53 in the first direction (X1, X2, or X3). This can reduce the distance between the portions of light entering the light receiving regions 53. This can produce a small photodetector 50. This also makes it possible to independently measure the intensities of the portions of light entering different regions in the light receiving face 52.

In the light receiving face 52, each light receiving region 53 has a quadrilateral outline. The shape of each light receiving region is not limited to a quadrilateral shape, and can be suitably designed in correspondence with the shape of the light entering the light receiving face 52. In the photodetector 50 illustrated in the drawings, each light receiving region 53 has a rectangular outline. Two of the four sides of a quadrilateral shape (short sides in the case of a rectangle) are parallel to the first direction. "Parallel" here includes tolerances of up to ±5 degrees.

The light receiving regions 53 have larger lengths in the second direction (Z1, Z2, Z3) than the lengths in the first direction (X1, X2, X3). In the light emitting device 100 illustrated in the drawings, all light receiving regions 53 satisfy this condition. One or more of the light receiving regions 53 having the same length in the first and second directions can be included. One or more the light receiving regions 53 having a larger length in the first direction than the length in the second direction can be included.

In the light receiving face 52, the light receiving regions 53 include two light receiving regions 53 having different lengths in the second direction (e.g., Z1<Z2). A length in the second direction of at least one first light receiving region 53 arranged at an end of the light receiving face 52 can be smaller than a length in the second direction of a second light receiving region 53 arranged next to the first light receiving region 53 in the light receiving face 52. Moreover, the lengths in the second direction of the two light receiving regions 53 arranged at both ends can be different (e.g., Z1<Z3).

Arranging a smaller length light receiving region 53 next to a larger length light receiving region 53 can make a space available in the light receiving face 52 attributable to the length difference (e.g., Z2−Z1>0). Disposing a conducting region 55 in this space, as described below, can promote the size reduction of the photodetector 50. The size of Z2−Z1 is, for example, 50 µm to 150 µm, preferably 60 µm to 100 µm. These ranges allow the space to be utilized for a conducting region 55, while providing light receiving regions 53 having appropriate sizes.

The light receiving regions 53 are arranged so as to be aligned at one of the two ends in the second direction. In other words, the straight line connecting each of the light receiving regions 53 at one of the two ends in the second direction is parallel to the first direction. Parallel here includes tolerances of up to ±5 degrees. Aligning them at one end can reduce the length of the photodetector 50 in the second direction, thereby contributing to size reduction.

These magnitude relations and positional relationships among the light receiving regions 53 are not necessarily required of the light emitting device 100.

The photodetector 50 has one or more wiring regions 54. The one or more wiring regions 54 are disposed on the light receiving face 52. The one or more wiring regions 54 can be disposed on a face other than the light receiving face 52. The wiring regions 54 are electrically connected to the light receiving regions 53, respectively.

In the photodetector 50 illustrated in the drawings, the wiring regions 54 disposed on the light receiving face 52 achieve the electrical connection of all of the light receiving regions 53 arranged in the light receiving face 52. Specifically, four wiring regions 54 are provided for the electrical connection of three light receiving regions 53. In other words, the number of the wiring regions 54 is greater than the number of the light receiving regions 53 in the light receiving face 52 of the photodetector 50.

Three of the four wiring regions 54 are anode electrodes respectively corresponding to the three light receiving regions 53. The remaining wiring region 54 is a common cathode electrode for the three light receiving regions 53.

In the photodetector 50 illustrated in FIG. 9, an insulating layer 59 having an opening portion is formed on the upper face of the n-type semiconductor substrate 58. The opening portion is provided in the center of the light receiving face 52. In the light receiving face 52, the region of the insulating layer 59 where the opening portion is provided will be referred to as the central region 56. The wiring regions 54 are located on the insulating layer 59 insulated from the n-type semiconductor substrate 58. All of the light receiving regions 53 are arranged in the central region 56. The light receiving regions 53 can be covered with a protective film. Covering the light receiving regions 53 with a light transmissive protective film can protect them without hindering detection of light.

The wiring regions 54 are located in the end regions 57 (FIG. 8 and FIG. 9) in the light receiving face 52 provided at a distance from the central region 56 in the first direction. Positioning the wiring regions 54 in the end regions 57 can suppress the photodetector 50 from being large in the second direction. The wiring regions 54 are provided in two end regions 57, one located at a distance from the central region 56 in the positive first direction (+first direction) and the other located at a distance from the central region in the negative first direction (−first direction). For the purpose of distinguishing the end regions 57, they may be referred to as a first end region 57 and a second end region 57. The wiring regions 54 can be disposed only in one of the first and second end regions 57.

The photodetector 50 has one or more mounting regions 42 in the light receiving face 52. The mounting regions 42 are regions utilized to support another constituent element. One or more mounting regions are provided outward of the central region 56. One or more mounting regions are provided between an end region 57 and the central region 56. One or more mounting regions are provided between the first end region 57 and the second end region 57.

One or more mounting regions 42 can be provided between the first end region 57 and the central region 56, and one or more mounting regions 42 can be provided between the second end region 57 and the central region 56. In this case, the photodetector 50 would have a plurality of mounting regions 42.

As shown in FIG. 8, the one or more mounting regions 42 do not protrude in the second direction beyond the light receiving region 53 having the largest length in the second direction. In other words, the one or more mounting regions 42 in the top view are interposed between two imaginary straight lines extending along the first direction each passing one of two ends in the second direction of this light receiving region 53. This can suppress the photodetector 50 from being long in the second direction, thereby contributing to size reduction.

As shown in FIG. 9, the upper face(s) of the one or more mounting regions 42 are positioned higher (upwards) than the upper faces of the light receiving regions 53. This can allow another constituent element to be bonded in contact with a mounting region 42, thereby improving the bonding stability. Moreover, for example, another constituent element can be mounted on the photodetector 50 without being into contact with any light receiving region 53.

Another constituent element can be bonded in the one or more mounting regions 42. The one or more mounting regions 42 can each be constructed with, for example, a metal film or metal bumps disposed on the insulating layer 59. By utilizing a mounting region 42, any other constituent element to be arranged on the photodetector 50 can be supported in a stable manner.

In the photodetector 50 illustrated in FIG. 8, each of the mounting regions 42 is quadrilateral shaped. The first mounting region 42 and the second mounting region 42 have the same shape. The shape of each mounting region 42 is not limited to a quadrilateral. The mounting regions do not have to have the same shape. The area between each end region 57 and the central region 56 that is available as a mounting region 42, for example, is in the range of from 0.05 mm$^2$ to 0.2 mm$^2$.

A region of the photodetector 50 other than the mounting regions 42 can be utilized to bond another constituent element. In other words, the region utilized to support another constituent element is not limited to the one or more mounting regions 42. The mounting regions 42 can be utilized to play a supplementary role for mounting stability or convenience purposes.

The photodetector 50 is provided with one or more conducting regions 55 in the light receiving face 52. A conducting region 55 is physically and electrically connected to the light receiving regions 53 and the wiring regions 54. A conducting region 55 electrically connects a receiving region 53 and a wiring region 54.

In the photodetector 50 shown in FIG. 8, each of the conducting regions 55 is provided at a region between the central region 56 and an end region 57 where no mounting region 42 is present.

In the photodetector 50 shown in the drawing, multiple conducting regions 55 are provided to be respectively connected to the light receiving regions 53 arranged in the light receiving face 52. Specifically, three conducting regions 55 provided are respectively connected to the three light receiving regions 53. In other words, the number of the conducting regions 55 is equal to the number of the light receiving regions 53 arranged in the light receiving face.

Protective Device 60A

A protective device 60A is a circuit element used to prevent the breakage by applying an overcurrent to a certain element (e.g., a light emitting element 20). A typical example of a protective device 60A is a constant voltage diode such as a Zener diode. For the Zener diode, a Si diode can be employed.

Temperature Measuring Element 60B

A temperature measuring element 60B is an element utilized as a temperature sensor for measuring the surrounding temperature. For the temperature measuring element 60B, for example, a thermistor can be used.

Wire 70

A wire 70 is a line shaped conductor having bonding parts at both ends. In other words, a wire 70 has bonding parts to be bonded to other constituent elements at both ends of the line shaped portion. The wire 70 is, for example, a metal wire. Examples of metals include gold, aluminum, silver, copper, and the like.

Lens Member 80

A lens member 80 is formed to have one or more lens faces. The lens member 80 collimates incident light. For example, the one or more lens faces are designed to receive the light diverging from a focal position, converting the divergent light into collimated light through refraction, and then allowing the light to exit from the lens member 80. The lens faces are spherical or aspherical. The lens faces are formed on the incident side surface and/or the output side surface of the lens member 80. The incident side surface and/or the output side surface of the lens member 80 can be provided with an optical film such as an antireflective film or protective film. In the lens member 80 shown in the drawings, a concave lens face is formed on the incident side and a convex lens face on the output side. Multiple lens faces can be formed on the incident side surface, and the lens member 80 can have one or more lens faces formed on the incident side surface. Multiple lens faces can be formed on the output side surface, and one or more lens faces can be formed on the output side surface of the lens member 80.

The lens member 80 can be formed of a light transmissive material, such as glass or plastic. The portion of the lens member 80 not transmitting light can have a shape appropriately determined, but is preferably shaped to be fixed to another constituent element. In the lens member 80 shown in the drawings, the lens part 80 has a flat lower face when positioned such that the optical axis extends in the horizontal direction, and the lower face can function as the bonding face.

Second Substrate 90

A second substrate 90 has a plurality of wiring regions 96. In FIG. 4, the wiring regions 96 on the second substrate 90 are indicated with hatching lines. The wiring regions 96 of the second substrate go through the second substrate 90 to be electrically connected to the wiring regions provided at the lower face of the second substrate 90. The wiring regions electrically connected to the wiring regions 96 can be provided not only on the lower face of the second substrate 90, but also on any other surface (upper face and outer lateral faces).

The second substrate 90 can be formed using a ceramic as a primary material. Examples of ceramics for use as the second substrate 90 include aluminum nitride, silicon nitride, aluminum oxide, silicon carbide and the like.

The second substrate 90 preferably includes a portion formed of a higher heat-dissipating (higher thermal conductivity) material than ceramics. In the second substrate 90 illustrated in FIG. 4, the second substrate 90 has a thermally conductive member 97 embedded therein. The thermally conductive member 97 fills an opening that goes through from the upper face to the lower face of the second substrate 90. The thermally conductive member 97 is provided in the region that faces the lower face of the first substrate 15. The thermally conductive member 97 can be formed of any of the high thermal conductivity materials described earlier. The thermally conductive member 97 can have a shape appropriately determined. In the second substrate 90 shown in FIG. 4, the thermally conductive member 97 is disposed in the central region interposed by two groups of wiring regions 96 arranged in the upper and lower rows in a plane view of FIG. 4.

The second substrate 90 supports the constituent elements of the light emitting device 100, and has the structure for electrically connecting the electronic parts included in the constituent elements. The second substrate 90 can support electronic parts, or optical parts other than the constituent elements of the light emitting device 100.

Light Emitting Device 100

A light emitting device 100 will be explained next.

In the light emitting device 100 explained as an example below, the one or more light emitting elements 20 are edge-emitting semiconductor laser elements (laser diodes). The wires 70 include a plurality of first wires 71 electrically connected to the light emitting elements 20 and a plurality of second wires 72 electrically connected to the photodetector 50.

In the light emitting device 100, the one or more light emitting elements 20 are arranged in a package 10. The one or more light emitting elements 20 are disposed on a mounting face 11M and surrounded by a wall part 12. Each light emitting element 20 is disposed on the mounting face 11M via a submount 30. The light emitting elements 20 can be disposed on one or more submounts 30. The one or more light emitting elements 20 can be directly disposed on the mounting face 11M without a submount 30 being interposed therebetween.

The one or more light emitting elements 20 laterally emit light. The one or more light emitting elements 20 emit divergent portions of light from the emission faces 21 towards the outer lateral face having the light extraction face 10A among one or more outer lateral faces of the package 10. The light emitted from an emission face 21 advancing along the optical axis advances along the second direction. The light emitted from an emission face 21 advancing along the optical axis advances in parallel with the mounting face 11M.

In the light emitting device 100, the submount 30 is disposed in the package 10. The submount 30 is bonded to the light emitting elements 20 using one of the bonding faces. The submount 30 is bonded to the mounting face 11M using the other bonding face located on the opposite side. The light emitting device 100 can include a plurality of submounts 30. In the case in which the light emitting device 100 include a plurality of submounts 30, the number of light emitting elements 20 bonded to one submount 30 can be one.

In the light emitting device 100, the photodetector 50 is disposed in the package 10. The photodetector 50 is disposed on the mounting face 11M. The photodetector 50 is surrounded by the wall part 12. The photodetector 50 is directly disposed on the mounting face 11M. The photodetector 50 can be disposed via a support member or the like instead of being directly disposed on the mounting face 11M.

The photodetector 50 is disposed between the light extraction face 10A and the light emitting elements 20 in the top view. The photodetector 50 is also positioned between the submount 30 and the light extraction face 10A. The distance between the photodetector 50 and the light emitting elements 20 is smaller than the length of the photodetector 50 in the second direction. The distance between the photodetector 50 and the incident face of the package 10 from which the light emitted from the light emitting elements 20 enters is smaller than the length of the photodetector 50 in the second direction. This can promote the size reduction of the package 10, thereby contributing to the size reduction of the light emitting device 100.

The photodetector 50 is disposed to face the light receiving face 52 up. In the light emitting device 100 illustrated in the drawings, the light receiving face 52 is in parallel with the mounting face 11M. Parallel here includes tolerances of up to ±5 degrees. The bonding face 51 of the photodetector 50 is bonded to the mounting face 11M via a metal layer 17 (FIG. 9).

In the light emitting device 100, the optical member 40 is disposed in the package 10. Moreover, the optical member 40 is positioned above the photodetector 50. The optical member 40 is disposed on the upper face of the photodetector 50. The optical member 40 is bonded to the photodetector 50. The optical member 40 is mounted such that the lower face of the optical member 40 faces the light receiving face 52 of the photodetector 50. The optical member 40 is fixed to the photodetector 50 in a mounting region 42 of the light receiving face 52.

The method of fixing the optical member 40 to the photodetector 50 is not limited to this example. For example, the lower face of the optical member 40 can be bonded to the light receiving face 52 of the photodetector 50 via a transparent resin layer or adhesive layer. The refractive index of such a resin layer or adhesive layer is higher than the refractive index of the air (about 1.0), and is close to the refractive index of glass (e.g., 1.5). Accordingly, filling the space between the optical member 40 and the light receiving face 52 of the photodetector 50 with a resin layer or adhesive layer can make it difficult to allow the light receiving face 52 to reflect the light reflected by the optical member 40.

In the case in which the optical member 40 is bonded to the light receiving face 52 of the photodetector 50 via metal bumps, an antireflective film can be deposited on the light receiving face 52. Such an antireflective film can reduce the reflection of light at the light receiving face 52 and can function to protect the light receiving face 52.

The divergent light(s) from one or more light emitting elements 20 enter the optical member 40. Moreover, the entire main portion of the light from one or more light emitting elements 20 enters the optical member 40. No other optical member such as a lens is disposed in the optical paths of the divergent portions of light emitted from one or more light emitting elements 20 before entering the optical member 40. The light emitted from the light emitting element(s) 20 reaches the optical member 40 without changing the direction of travel. Not having any other constituent element interposed therebetween allows the light emitted from the emission face(s) 21 to reach the optical member 40 in a short distance. Another member can be interposed between an emission face 21 and the optical member 40.

The optical member 40 reflects a portion of the incident divergent light and transmits the remainder of the light. The light that has entered the partially reflecting face 41 of the optical member 40 is divided into transmitted light and reflected light. The transmitted light exits the package 10 from the light extraction face 10A, and the reflected light irradiates the photodetector 50. In the light emitting device 100 illustrated in the drawings, between the transmitted light and the reflected light divided by the optical member 40, the transmitted light is utilized as the main light, and the reflected light is utilized as the monitoring light.

The light emitted from a light emitting element 20 enters from one of the lateral faces of the optical member 40, passes through the partially reflecting face 41, exits from the opposite lateral face, passes through the wall part 12 of the package 10, and laterally exits from the light transmitting region 13. The more constituent elements there are on the mounting face 11M, the larger the outer shape of the package 10 becomes. The lateral faces can be more useful than the upper face in suppressing the outer shape from becoming large. In the case in which the outer shape can be reduced by the lateral faces rather than the upper face, allowing light to exit from a lateral side can reduce the need to increase the size of the face that includes the light extraction face 10A.

Furthermore, the light emitted from a light emitting element 20 enters from one of the lateral faces of the optical member 40, is reflected by the partially reflecting face 41, exits from the lower face of the optical member 40, and irradiates the light receiving face 52 of the photodetector 50. Each of the transmitted light and the reflected light is divergent light. The optical member 40 reflects an incident light downwards.

The light receiving face 52 of the photodetector 50 receives divergent light reflected by the optical member 40. An emission region 53 receives a light reflected by the optical member 40. Among the main portion of the light emitted from a light emitting element 20, the entire portion reflected by the optical member 40 irradiates a light receiving region 53.

The light receiving face 52 may be orthogonal to an emission face 21. It does not have to be orthogonal. The light receiving face 52 may be in parallel with the mounting face 11M. It does not have to be in parallel. Orthogonal and parallel here include tolerances of up to ±5 degrees.

The light receiving face 52 is positioned lower than the emission point of the light from a light emitting element 20. In the light emitting device 100, the height from the mounting face 11M to the light receiving face 52 is smaller than the height from the mounting face 11M to a light emitting element 20. Such a positional relationship makes it possible to provide a light receiving region 53 directly under the partially reflecting face 41, and can reduce the size of the light emitting device 100 in the second direction.

In the top view, the length of the light receiving face 52 in the first direction is larger than the length of the submount 30 in the first direction. In the top view, the difference between the length of the light receiving face 52 in the first direction and the length of the submount 30 in the first direction is smaller than the length of the submount 30 in the first direction. Satisfying these relationships can suppress the relative size ratio of the photodetector 50 to the submount 30 from increasing, and can contribute to the size reduction of the light emitting device 100.

In the top view, the one or more light receiving regions 53 are disposed in the area interposed between the two imaginary straight lines parallel to the second direction while extending out the two sides of the submount 30 that cross the first direction. In the top view, the one or more wiring regions 54 are disposed on the outside of the area interposed by the two straight lines. Satisfying these relationships can reduce the size of the light emitting device 100 in the first direction.

In the top view, the one or more mounting regions 42 are positioned in the area interposed between the two imaginary straight lines parallel to the second direction while extending out the two sides of the submount 30 that cross the first direction. In the top view, the one or more mounting regions 42 are disposed on the outside of the area interposed between the two imaginary straight lines parallel to the second direction while extending out the two sides of the region where one or more light emitting elements 20 are disposed that cross the first direction. Satisfying these relationships can reduce the size of the light receiving face 52 in the first direction.

The sum of the second direction length of the light emitting element 20 having the largest second direction length and the second direction length of the photodetector 50 is at least 50% of the second direction length of the mounting face 11M. In the case in which the light emitting elements 20 are disposed on the mounting face 11M via the submount 30, the sum of the second direction length of the submount 30 and the second direction length of the photodetector 50 is at least 50% of the second direction length of the mounting face 11M. Satisfying these relationships can prevent the internal space of the package 10 from becoming excessive, and can contribute to the size reduction of the light emitting device 100.

In the light emitting device 100, one or more protective devices 60A are disposed in the package 10. The one or more protective devices 60A are disposed on the mounting face 11M. The protective devices 60A are disposed for the purpose of protecting the light emitting elements 20. In the light emitting device 100, one protective device is disposed for one light emitting element 20. In other words, as many protective devices 60A as the light emitting elements 20 are arranged.

In the top view, the one or more protective devices 60A are disposed on the outside of the area interposed between the two imaginary straight lines extending out the two sides of the area where the one or more light emitting elements 20 are disposed that cross the first direction. In the top view, the one or more protective devices 60A are disposed on the outside of the area interposed between the two imaginary straight lines parallel to the second direction and extending out the two sides of the submount 30 that cross the first direction.

In the light emitting device 100, a temperature measuring element 60B is disposed in the package 10. The temperature measuring element 60B is disposed on the mounting face 11M. The temperature measuring element 60B is disposed for the purpose of measuring the temperature of a light emitting element 20.

In the top view, the temperature measuring element 60B is disposed on the outside of the area interposed by the two imaginary straight lines extending out the two sides of the area where one or more light emitting elements 20 are disposed that cross the first direction. In the top view, the temperature measuring element 60B is disposed on the outside of the area interposed between the two imaginary straight lines parallel to the second direction and extending out the two sides of the submount 30 that cross the first direction.

In the top view, any straight line parallel to the first direction and passing the photodetector 50 does not pass any of the protective devices 60A. In the top view, any straight line parallel to the first direction and passing the photodetector 50 does not pass the temperature measuring element 60B. Arranging the protective devices 60A and/or the temperature measuring element 60B with such relations, the package 10 is less likely to be large in the first direction because the photodetector 50 has larger length in the first direction than the one or more light emitting elements 20 or the submount 30.

In the light emitting device 100, in the top view, the first wires 71 are bonded to the wiring regions 14 of the package 10 on the light emitting element 20 side (a side including the faces opposite the emission faces 21) using the straight line extending out one of the emission faces 21 of the light emitting elements 20 as a border. This can more effectively suppress the first wires 71 from hindering the optical paths.

The second wires 72 are bonded to the wiring regions 14 at one end of the respective second wires 72. The second wires 72 are bonded to the wiring regions 54 of the photodetector 50 at the other end of the respective second wires 72. Providing the wiring regions 54 in the end regions 57 of the photodetector 50 can reduce the distance between the wiring regions 14 of the package 10 and the wiring regions 54 of the photodetector 50 as well as reducing the lengths of the second wires 72. This can also reduce the heights of the second wires 72, thereby achieving a thin light emitting device with a reduced height.

In the light emitting device 100, the second wires 72 are bonded to the wiring regions 14 on the base 11 and the wiring regions 54 on the photodetector 50 in the package 10. In the example shown in the drawings, all wires (second wires 72) used for electrically connecting the photodetector 50 are bonded to the wiring regions 14 located in the portion X indicated by the broken lines in FIG. 7 and FIG. 8. More specifically, the second wires 72 in the top view are bonded to the wiring regions 14 of the package 10 on the photodetector 50 side using the straight line extending out one of the emission faces 21 of the light emitting element 20 as a border. This can more effectively suppress the second wires 72 from hindering the optical paths of the light.

At least one of the second wires 72 is bonded to the wiring regions 14 of the package 10 in the area interposed between the two imaginary straight lines parallel to the first direction while extending out the two sides of the light receiving face 52 that cross the second direction and the straight line extending in the first direction along the other end. Multiple or all of the second wires 72 are preferably bonded to the wiring regions 14 in this area. Employing such a structure can reduce the lengths of the second wires 72.

In the light emitting device 100, a sealed space is created in the package 10. Bonding the first substrate 15 and the cap 16 under predetermined ambient conditions can create a hermetically sealed space in the package 10. Creating a hermetically sealed space for the light emitting elements 20 can reduce quality degradation attributable to dust. In the case in which the entire light emitting device 100 is used in the environment or ambience free of concerns for quality degradation attributable to dust or moisture in the air, the cap 16 is unnecessary. For example, when the entire light emitting device 100 is sealed by an enclosure, it is unnecessary to cover the light emitting elements 20, the optical member 40, and the photodetector 50 with the cap 16.

In the light emitting device 100, the package 10 is mounted on the second substrate 90. The first substrate 15 of the package 10 is mounted on the second substrate 90. The various electronic parts arranged on the mounting face 11M can be electrically connected to a circuit external to the light emitting device 100 via the wiring regions 14 of the first substrate 15 and the wiring regions 96 of the second substrate 90.

In the light emitting device 100, the lens member 80 is mounted on the second substrate 90. Without limiting to the second substrate 90, the lens member 80 can be disposed on the first substrate 15 of the light emitting device 100 shown in the drawings by making the first substrate 15 the same size as the second substrate 90, for example. The lens member 80 is positioned outside of the package 10, and not surrounded by the wall part 12. This can reduce the size of the package 10.

The lower face of the lens member 80 is lower than the mounting face 11M. Bonding the lower face of the lens member 80 to the upper face of the second substrate 90 can position the lower face of the lens member 80 lower than the mounting face 11M. Such an arrangement allows the light exiting from the package 10 to enter the lens member 80 at a lower position than the plane that includes the mounting face 11M.

The portions of light of the one or more light emitting elements 20 exit from the package 10 through the light transmitting region 13, and then enter the lens member 80. The incident portions of light are collimated by the lens member when output.

The central axis of the light extracted from the light extraction face 10A is directed in the direction in which the mounting face 11M of the base 11 extends (horizontal direction). The optical axis of the lens face of the lens member 80 from which light exits and the central axis of the light extracted from the light extraction face 10A are at the same height from the mounting face 11M of the base 11.

The central axis of the light extracted from the light extraction face 10A is perpendicular to the light extraction face 10A. The optical axis of the lens face of the lens member 80 from which light exits is also perpendicular to the light extraction face 10A. Perpendicular here includes tolerances of up to ±5 degrees. The central axis of the light is not necessarily limited to being perpendicular to the light extraction face 10A.

In the light emitting device 100 illustrated in the drawings, a plurality of light emitting elements 20 are arranged in the package 10. The light emitting elements 20 are arranged such that the emission faces 21 face in the same direction. The light emitting elements 20 are arranged such that the emission faces 21 are in parallel. The lights emitted from the emission faces 21 of the light emitting elements 20 advance towards the lateral face of the package 10 that includes the light extraction face 10A. The emission faces 21 of the light emitting elements 20 do not need to be aligned to be coplanar or in parallel with one another.

The light emitting elements 20 can be three semiconductor laser elements as in the case of the light emitting device 100 illustrated in the drawings. The three light emitting elements 20 emit light having different peak wavelengths from one another from the emission faces 21. The three light emitting elements 20 can be configured as a blue light emitting semiconductor laser element, a green light emitting semiconductor laser element, and a red light emitting semiconductor laser element. The form in which the three light emitting elements 20 configured as three colors, RGB, can be employed, for example, in a color image display application. The colors of light emitted by the light emitting elements 20 are not limited to these or visible light.

The light receiving face 52 of the photodetector 50 is provided with at least as many light receiving regions 53 as the light emitting elements 20. The number of light receiving regions 53 is equal to or greater than the number of light emitting elements 20 arranged in the package 10.

One light receiving region 53 is irradiated by the light emitted from one light emitting element 20 that is reflected by the optical member 40. Each of the light receiving regions 53 is irradiated by the part of the major portion of the light from the corresponding light emitting element 20 that is reflected by the optical member 40. The major portion of the light emitted from one light emitting element 20 irradiates only one of the light receiving regions 53. Accordingly, the major portion of the light emitted from one light emitting element 20 irradiates one of the light receiving regions 53, and does not irradiate any light receiving region 53 different from this light receiving region 53. The major portion of the light emitted from one light emitting element 20 irradiates one of the light receiving regions 53, and does not irradiate any other light receiving regions 53. This makes it possible to independently measure the intensities of the lights emitted from the individual light emitting elements 20. In the light emitting device 100 illustrated in the drawings, the three light receiving regions 53 respectively correspond to the three light emitting elements 20.

In comparing the light emitting elements 20 and the photodetector 50, the distance between two adjacent light emitting elements 20 is larger than the distances between the two light receiving regions 53 corresponding to the light emitting elements 20. Moreover, the distance between any selected two of the light emitting elements 20 arranged in the first direction is larger than the distance between the two light receiving regions 53 corresponding to the light emitting elements 20. Disposing a plurality of light receiving regions 53 in the light receiving face 52 of a single photodetector 50 allows for the arrangement of the light receiving regions 53 at narrow intervals, thereby contributing to the size reduction of the light emitting device 100.

Furthermore, the lights emitted from the light emitting elements 20 exiting the package 10 from the light transmitting region 13 enter the lens member 80 and exit a single lens face. The lights exiting the single lens face re collimated by the lens member 80. In the light emitting device 100 illustrated in the drawings, the lights emitted from the three light emitting elements 20 exiting the package 10 from the light transmitting region 13 enter the lens member 80 and exit the lens face as collimated portions of light. Employing a single lens face to collimate the lights from multiple light emitting elements 20 can reduce the size of the lens member 80 as compared to employing individual lens faces for the light emitting elements 20. This can contribute to the size reduction of the light emitting device 100.

The divergence angles of the lights emitted from two adjacent light emitting elements 20, and the distances between the light emitting elements 20 to the light receiving face 52 will be explained with reference to FIG. 10 and FIG. 11. FIG. 10 and FIG. 11 indicate that the X, Y, and Z axes are orthogonal to one another.

The divergent lights emitted from the light emitting elements 20 include the lights advancing in a first axis direction (Z axis direction) parallel to an XZ plane. The optical member 40 reflects a portion of the lights advancing in the Z axis direction to allow the lights to advance in a second axis direction (Y axis direction) that are perpendicular to an XZ plane (first plane) and in parallel with a YZ plane (second plane). The divergent portions of light transmitted through the optical member 40 advance in the Z axis direction. The divergent portions of light entering the optical member 40 are, at least, the light that diverges in a third axis direction (X axis direction) that is in parallel with an XZ plane (first plane) and perpendicular to the Z axis direction.

A first optical path length from the emission face 21 of one of two adjacent light emitting elements 20 (first light emitting element) to the light receiving face 52 of the photodetector 50 will be denoted as L1, the divergence half angle of the major portion of the light from the first light emitting element 20 diverging in the third axis direction will be denoted as θ1, and the radius of the irradiated region 22 of the part of the major portion of the light from the first light emitting element 20 that becomes incident on the light receiving face 52 will be denoted as R1. The light emitted from a light emitting element 20 can also diverge in the direction perpendicular to the third axis direction. In the case in which the light emitting element 20 is a semiconductor laser element, the irradiated region 22 is defined by the major portion of the divergent light emitted by the first light emitting element 20. In other words, the irradiated region 22 corresponds to the region having an intensity of at least $1/e^2$ relative to the peak intensity value in the FFP light intensity distribution formed by the light incident on the light receiving face 52.

Similarly, a second optical path length from the emission face 21 of the other of the two adjacent light emitting elements 20 (second light emitting element) to the light receiving face 52 of the photodetector 50 will be denoted as L2, the divergence half angle of the major portion of the light from the second light emitting element 20 will be denoted as θ2, and the radius of the irradiated region 22 of the part of the major portion of the light from the second light emitting element 20 that becomes incident on the light receiving face 52 will be denoted as R2.

In order to reduce the distance between two adjacent light emitting elements 20, it is preferable to allow the horizontal divergent angle, rather than the vertical divergent angle, to correspond to θ1. At this time, the outlines of the major portions of the lights in the FFP light intensity distribution at the light receiving face 52 resemble ellipses each having a minor axis in the first direction and a major axis in the second direction. The ellipses increase in size in proportion to the optical path lengths L1 and L2 that are from the emission faces 21 of the light emitting elements 20 to the light receiving face 52. Here, the optical path lengths L1 and L2 are optical distances that depend on the refractive index of a medium through which the light propagates. For example, in the case in which the optical member 40 is formed of optical glass having a refractive index of about 1.5, the optical distance in the optical member 40 increases in proportion to the refractive index.

The radii R1 and R2 of the irradiated regions 22 formed in the light receiving face 52 by the two adjacent light emitting elements 20 are L1·tan θ1 and L2·tan θ2, respectively. Assuming that the center-to-center distance of the two adjacent light emitting elements 20 (distance between emitters) is P12, the gap between the two adjacent irradiated regions 22 in the light receiving face 52 is P12−(L1·tan θ1+L2·tan θ2). The adjacent irradiated regions 22 do not overlap in the light receiving face 22 when P12−(L1·tan θ1+L2·tan θ2) is at least zero.

Excessively large optical path lengths L1 and L2, which are from the emission faces 21 of the light emitting elements 20 to the light receiving face 52, would result in a negative value for the P12−(L1·tan θ1+L2·tan θ2) unless the distance P12 is increased. In this case, the adjacent irradiated regions 22 would overlap in the light receiving face 52. This, as a result, makes it impossible for the photodetector 50 to individually obtain output signals from the light emitting elements 20. In order to independently measure the optical outputs of the light emitting elements 20 corresponding to the receiving regions 53 based on the output signals of the photodetector 50 obtained individually from the light receiving regions 53, the value of the P12−(L1·tan θ1+L2·tan θ2) is preferably zero or higher.

In the light emitting device 100 illustrated in the drawings, the divergent lights emitted from the light emitting elements 20 are collimated by a single lens member 80. Accordingly, the lights emitted from all of the light emitting elements 20 is desirable to approximate to the optical axis of the lens member 80 as much as possible to pass through the lens face. At this point, there can be a need to suppress the P12 from increasing to the extent possible.

In the case of reducing the distance P12, it is necessary to reduce the (L1·tan θ1+L2·tan θ2) in order to make the P12−(L1·tan θ1+L2·tan θ2) zero or higher. Constructing the light emitting device 100 such that the optical path lengths L1 and L2 are short can reduce the distance P12 while making the P12−(L1·tan θ1+L2·tan θ2) zero or higher.

In the light emitting device 100 illustrated in the drawings, between the emission faces 21 of the light emitting elements 20 and the optical member 40 (particularly the partially reflecting face 41), a gas such as the air is present, but other components such as a lens or part of the package 10 are absent. This can make it possible to position the optical member 40 (particularly the partially reflecting face 41) close to the emission faces 21 of the light emitting elements 20. Positioning the optical member 40 close to the emission faces 21 of the light emitting elements 20 allows the lights emitted from the light emitting elements 20 to be divided into reflected light and transmitted light before they widely diverge.

According to such a light emitting device 100, before the divergent lights emitted from one or more light emitting elements 20 pass through the lens or the package, a portion of each divergent light is reflected by the optical member 40 and detected by the photodetector 50. This can reduce the distances travelled by the lights emitted from the emission faces 21 of the light emitting elements 20 until they reach the light receiving face 52 of the photodetector 50.

As a result of reducing the distances described above, even in the case in which a plurality of light emitting elements 20 are lined up, the spacing of the light emitting elements 20 can be reduced while preventing the divergent lights from overlapping one another in the light receiving face 52. This, as a result, allows for the employment of a small sized optical member 40.

As shown in the cross section in FIG. 10, the height H2 from the mounting face 11M of the base 11 of the package 10 to the light receiving face 52 of the photodetector 50 is smaller than the height H1 from the mounting face 11M to the upper face of the submount 30. Reducing the value of H1 minus H2 can reduce the first optical path length L1 and the second optical path length L2.

When a reduction in the value of H1 minus H2 is considered, the effect of vignetting on the light transmitting through the optical member 40 is preferably taken into account. For example, it is preferable to avoid the occurrence of a vignette attributable to the second substrate 90 before the major portion of the light emitted from the emission face 21 of a light emitting element 20 reaches the lens member 80. In this case, in addition to reducing THE value of H1 minus H2, securing a certain height H1 can be effective.

The same applies when replacing the height H1 with the height from the mounting face 11M to the emission point in the emission face 21 of a light emitting element 20. The relationship between the two adjacent light emitting elements 20 has been explained with reference to FIG. 11, but the same is true the case where three or more light emitting elements 20 are arranged.

As illustrated in FIG. 11, it is unnecessary to fit an entire irradiated region 22 inward of the corresponding light receiving region 53. An irradiated region 22 can partially be located outside (exceed) the corresponding light receiving region 53. However, the exceeded portion of the irradiated region 22 is preferably not included in any other light receiving region 53.

The irradiated regions 22 formed in the same light receiving face 52 by different light emitting elements 20 can have different shapes and sizes from one another. The shapes, sizes, and positions of the light receiving regions 53 can be adjusted in correspondence with the shapes, sizes, and positions of the irradiated regions 22 formed by the light emitting elements 20.

In this embodiment, in the light emitting device 100, the distance from an emission face 21 to the optical member 40 is, for example, 200 µm at most, preferably 150 µm at most, more preferably about 100 µm. Furthermore, the distance from the face of the optical member 40 from which the transmitted light exits to the wall part 12 of the package 10 can range, for example, from 100 µm to 500 µm.

In the case in which the center-to-center distance (distance between the emitters) P12 of the adjacent first and second light emitting elements in the range of from 100 µm to 500 µm, the first optical path length L1 and the second optical path length L2 are both in the range of from 200 µm to 1500 µm. In this case, for example, the height H1 is in the range of from 300 µm to 600 µm, and the height H2 is in the range of from 100 µm to 300 µm. In this example, the distance from the emission face 21 of a light emitting element 20 to the lens member 80 can be in the range of from 1200 µm to 5000 µm.

The gap between two light receiving regions 53 can be, for example, in the range of from 50 µm to 150 µm. The length of each light receiving region 53 in the first direction can be, for example, in the range of from 100 µm to 200 µm. The length of each light receiving region 53 in the second direction can be, for example, in the range of from 250 µm to 500 µm.

Second Embodiment

Figure 12:
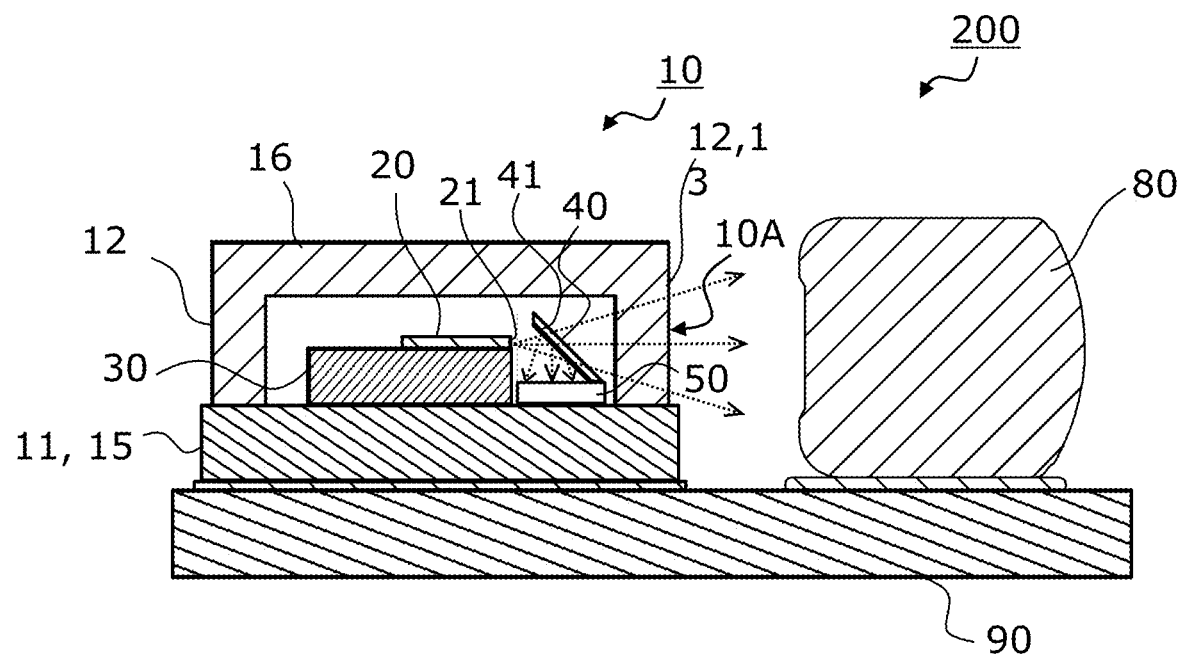
FIG. 12 is a cross-sectional view of a light emitting device according to a second embodiment.

A light emitting device 200 according to a second embodiment will be explained. FIG. 12 is a drawing explaining an exemplary form of the light emitting device 200.

The light emitting device 200 includes, as constituent elements, a package 10, one or more light emitting elements 20, a submount 30, an optical member 40, a photodetector 50, a protective device 60A, a temperature measuring element 60B, wires 70, a lens member 80, and a substrate 90 supporting these constituent elements.

The package 10, the one or more light emitting elements 20, the submount 30, the photodetector 50, the protective device 60A, the temperature measuring element 60B, the first wires 71, the lens member 80, and the substrate 90 are the same as or similar to those in the first embodiment as disclosed in in the drawings related to the first embodiment. The light emitting device 200 according to the second embodiment differs from the light emitting device 100 according to the first embodiment such that the shape of the optical member 40 is different.

The optical member 40 according to the second embodiment has a plate portion that has a partially reflecting face 41 on its surface. In the light emitting device 200 shown in FIG. 12, a transparent material having a higher refractive index than the air such as glass is absent between the emission faces 21 of the light emitting elements 20 and the partially reflecting face 41. Accordingly, the optical path lengths from the emission faces 21 of the light emitting elements 20 to the light receiving face 52 of the photodetector 50 can effectively be reduced. This can provide the effect of suppressing expansion of the irradiated regions in the light receiving face 52.

The shape of the optical member 40 is not limited to that illustrated in the drawing, and can be diverse. Any method can be used to fix the plate portion, which has a partially reflecting face 41 on its surface, to the photodetector 50. For example, a support member orthogonal to the plate portion can be fixed to both ends of the plate portion to bond the support member to the mounting region 42 located in the light receiving face 52 of the photodetector 50.

Alternatively, the optical member 40 can be placed on the mounting face 11M of the base 11. However, because variances in the position of the optical member 40 relative to the light receiving face 52 of the photodetector 50 during manufacturing is undesirable, the optical member 40 is preferably fixed to the photodetector 50. In the stage prior to placing the photodetector 50 on the mounting face 11M, the photodetector 50 and the optical member 40 can be handled as an integrated part ("photodetector with partially reflecting face" or "photodetector with beam splitter").

Variation

In the first and second embodiments, the photodetector 50 has the structure explained with reference to FIG. 8 and FIG. 9, for example, but the photodetector 50 is not limited to an element having such a structure. For example, a variation having conducting regions 55 modified to electrically connect the light receiving regions 53 and the wiring regions 54 can be employed.

Figure 13:
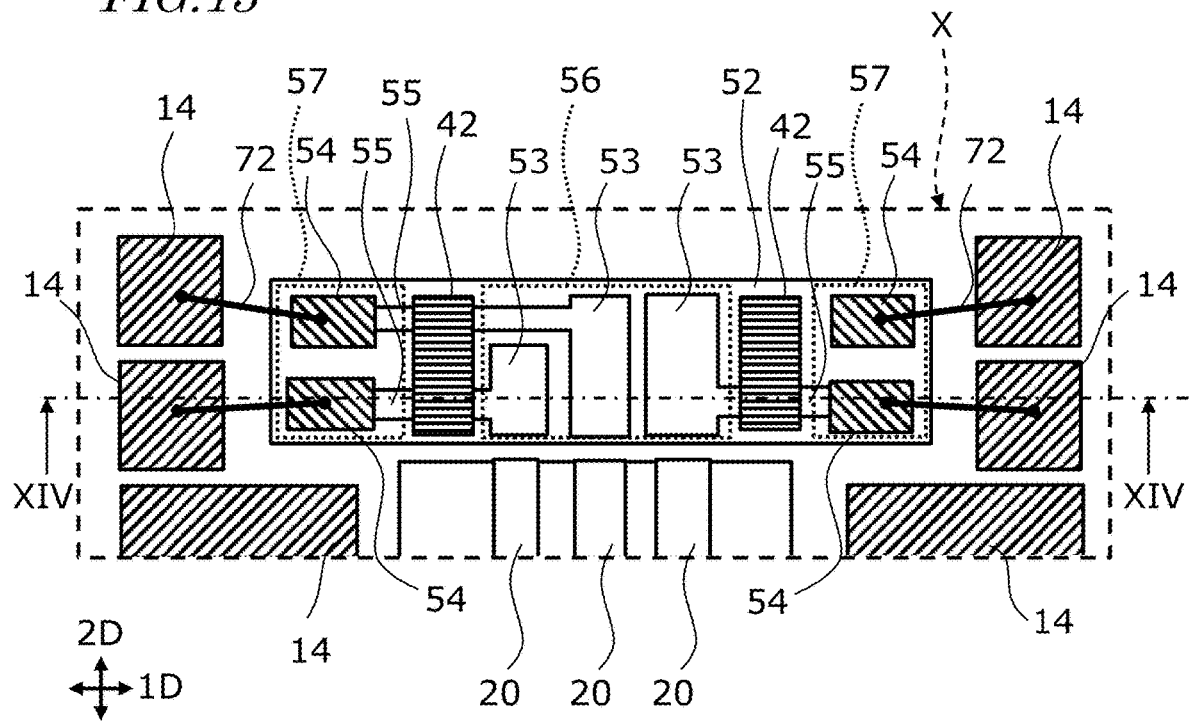
FIG. 13 is an enlarged top view of the portion X in a variation.
Figure 14:
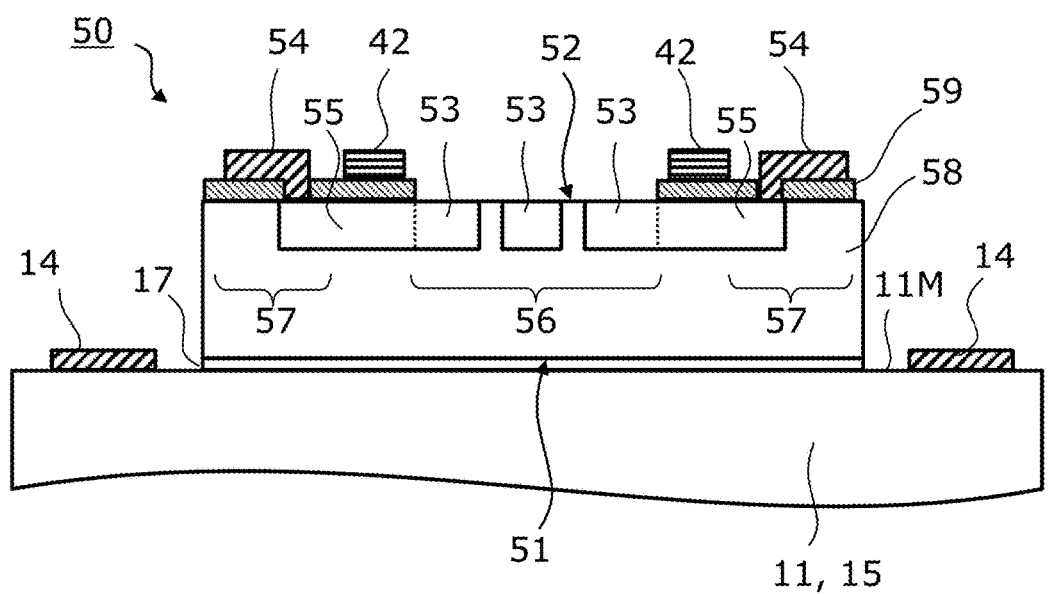
FIG. 14 is a cross-sectional view of the photodetector and the surrounding region taken along line XIV-XIV in FIG. 13.

FIG. 13 is an enlarged top view of the portion X of the photodetector 50 in the variation. FIG. 14 is a cross section taken along line XIV-XIV in FIG. 13 showing the photodetector 50 and the surrounding area thereof.

In this variation, the planar layout of the conducting regions 55 is the same as or similar to the planar layout of the conducting regions 55 shown in FIG. 8. The difference is in that the conducting regions 55 in the variation are constructed with impurity regions the same as or similar to the light receiving regions 53. Specifically, the conducting regions 55 are p-type impurity regions formed at predetermined positions in contact with the upper face of the n-type semiconductor substrate 58 (the light receiving face 52 of the photodetector 50).

In this variation, the layer for the conducting regions 55 and the layer for the mounting regions 42 are different, i.e., multilayered. Accordingly, the mounting regions 42 can be disposed so as to overlap the conducting regions 55. This makes it easier to expand the bonding area between the optical member 40 and the photodetector 50. However, the conducting regions 55, similar to the light receiving regions 53, generate electron-hole pairs when subjected to incident light. Accordingly, in this variation, caution is required so as not to allow the light to become incident on the conducting regions 55 by using methods such as containing the irradiated regions in the light receiving regions 53.

In each of the embodiments and variations described above, the optical member 40 is joined to the light receiving face 52 of the photodetector 50, but the method of fixing the optical member 40 to the package 10 is not limited to this example. The optical member 40 can be fixed to the submount 30, directly or indirectly joined to the upper face area or a lateral face area of the cap 16, or directly or indirectly joined to the mounting face 11M of the base 11.

Certain embodiments of the present invention have been described above, but the light emitting devices according to the present invention are not limited to those described in the embodiments. In other words, the present invention is achievable without being limited to the outer shapes or structures of the light emitting devices disclosed in the embodiments. For example, a light emitting device according to the present invention can be one that has no protective device. The present invention is applicable without necessarily and fully including all of the disclosed constituent elements. For example, in the event that a certain component of a light emitting device included in any of the disclosed embodiments is not recited in the claims, the claimed invention may still be applicable in view of the design flexibility of a person of ordinary skill in the art for such a component through the use of an alternative, an omission, a shape change, a change in the materials employed, or the like.

The light emitting devices according to any of the embodiments can be used in head mounted displays, projectors, lighting fixtures, displays, and the like.

What is claimed is:

1. A light emitting device comprising:
a package having a light extraction face that has a light transmitting region, and having a base that has a mounting face;
a first light emitting element disposed on the mounting face in the package and having an emission face configured to emit divergent light, the emission face being perpendicular to the mounting face of the base;
a photodetector disposed in the package; and
an optical member disposed in the package on the photodetector, wherein the light emitted from the first light emitting element is incident on the optical member, and wherein the optical member is configured to reflect a portion of the incident light and to transmit a remainder of the incident light therethrough; wherein:
the photodetector has a light receiving face configured to receive the light emitted from the first light emitting element and reflected by the optical member; and
the light emitted from the first light emitting element and transmitted through the optical member exits from the package through the light transmitting region.

2. The light emitting device according to claim 1, wherein:
the package comprises:
a wall part having the light extraction face;
the first light emitting element is disposed on the mounting face and surrounded by the wall part; and
the light transmitted through the optical member passes through the wall part and laterally exits from the light transmitting region of the package.

3. The light emitting device according to claim 2, wherein:
the package comprises:
a first substrate comprising the base, and
a cap that comprises the wall part and is fixed to the first substrate.

4. The light emitting device according to claim 2, wherein:
the photodetector is disposed on the mounting face;
a minimum distance from the mounting face to the light receiving face is smaller than a minimum distance from the mounting face to the first light emitting element; and
the optical member is configured to reflect a portion of the light emitted from the first light emitting element downwards.

5. The light emitting device according to claim 4, further comprising:
a submount to which the first light emitting element is bonded;
wherein the photodetector is located between the submount and the light extraction face of the wall part.

6. The light emitting device according to claim 1, further comprising:
a second light emitting element arranged along the first light emitting element in the package and having an emission face configured to emit divergent light; wherein:
the light emitted from the second light emitting element is incident on the optical member, and the optical member is configured to reflect a portion of the light that is emitted from the second light emitting element and to transmit a remainder of the incident light from the second light emitting element therethrough;
the light receiving face of the photodetector is configured to receive the light that is emitted from the second light emitting element and reflected by the optical member; and
the light emitted from the second light emitting element and transmitted through the optical member exits from the package through the light transmitting region.

7. A light emitting device comprising:
a first light emitting element having a first emission face configured to emit first light in a first direction, the first light emitting device having a first bottom face that is perpendicular to the first emission face;
a second light emitting element having a second emission face configured to emit second light in the first direction, the second light emitting device having a second bottom face that is perpendicular to the second emission face;
an optical member reconfigured to reflect a portion of the first light and to transmit a remainder of the first light, and configured to reflect a portion of the second light and to transmit a remainder of the second light; and
a photodetector configured to receive the first light and the second light reflected by the optical member;
wherein an optical path length of the first light from the first emission face to the photodetector and an optical path length of the second light from the second emission face to the photodetector are each 1.5 mm at most.

8. A light emitting device comprising:
a package having a light extraction face that has a light transmitting region, and having a base that has a mounting face;
a first light emitting element disposed on the mounting face in the package and having an emission face configured to emit divergent light, the emission face being perpendicular to the mounting face of the base;
a second light emitting element disposed on the mounting face in the package along the first light emitting element and having an emission face configured to emit divergent light, the emission face being perpendicular to the mounting face of the base;
an optical member disposed in the package, wherein the light emitted from the first light emitting element and the light emitted from the second light emitting element are incident on the optical member, and wherein the optical member is configured to reflect a portion of the incident light from the first light emitting element and a portion of the incident light from the second light emitting element and to transmit a remainder of the incident light from the first light emitting element and a remainder of the incident light from the second light emitting element therethrough; and
a photodetector disposed in the package and having a light receiving face configured to receive the light emitted from the first light emitting element and reflected by the optical member and the light emitted from the second light emitting element and reflected by the optical member;

wherein the light emitted from the first light emitting element and transmitted through the optical member and the light emitting from the second light emitting element and transmitted through the optical member exit from the package through the light transmitting region.

9. The light emitting device according to claim 8, wherein:
the optical member is joined to the photodetector.

10. The light emitting device according to claim 8, wherein:
the light receiving face of the photodetector has a first light receiving region and a second light receiving region;
a major portion of the light emitted from the emission face of the first light emitting element irradiates the first light receiving region and does not irradiate the second light receiving region; and
a major portion of the light emitted from the emission face of the second light emitting element irradiates the second light receiving region and does not irradiate the first light receiving region.

11. The light emitting device according to claim 8, further comprising:
a third light emitting element arranged along the first light emitting element and the second light emitting element in the package and having an emission face configured to emit divergent light; wherein:
light emitted from the third light emitting element is incident on the optical member, and the optical member is configured to reflect a portion of the light that is emitted from the third light emitting element and to transmit a remainder of the incident light from the third light emitting element therethrough;
the light receiving face of the photodetector is configured to receive the light that is emitted from the third light emitting element and is reflected by the optical member;
the light emitted from the third light emitting element and transmitted through the optical member exits from the package through the light transmitting region; and
the first light emitting element, the second light emitting element, and the third light emitting element are configured to emit light having peak wavelengths different from one another.

12. The light emitting device according to claim 11, further comprising:
a lens member comprising one or more lens faces configured to collimate light that is emitted from the first light emitting element, the second light emitting element, and the third light emitting element and exits from the package through the light transmitting region.

13. The light emitting device according to claim 8, further comprising:
a lens member comprising one or more lens faces configured to collimate the light that is emitted from the first light emitting element and exits the package through the light transmitting region.

14. The light emitting device according to claim 13, wherein:
the lens member is not surrounded by the wall part.

15. The light emitting device according to claim 13, further comprising:
a second substrate on which the package and the lens member are arranged.

16. The light emitting device according to claim 8, further comprising:
a lens member comprising one or more lens faces configured to collimate the light that is emitted from the first light emitting element and the second light emitting element and exits from the package through the light transmitting region.

17. The light emitting device according to claim 8, wherein:
a portion of the light emitted from the first light emitting element advances in a first axis direction parallel to a first plane;
the optical member is configured to reflect a portion of the light advancing in the first axis direction to allow the portion of the light to advance in a second axis direction parallel to a second plane that is perpendicular to the first plane; and
the light that is incident on the optical member diverges at least in a direction along a third axis that is in parallel with the first plane and perpendicular to the first axis.

18. The light emitting device according to claim 17, further comprising:
a lens member comprising one or more lens faces configured to collimate the light that is emitted from the first light emitting element and exits the package through the light transmitting region, wherein:
the package comprises:
a wall part having the light extraction face;
the first light emitting element is disposed on the mounting face and surrounded by the wall part; and
the light transmitted through the optical member passes through the wall part and laterally exits from the light transmitting region of the package.

19. The light emitting device according to claim 18, wherein:
the package comprises:
a first substrate comprising the base, and
a cap that comprises the wall part and is fixed to the first substrate.

20. The light emitting device according to claim 18, wherein:
the photodetector is disposed on the mounting face;
a minimum distance from the mounting face to the light receiving face is smaller than a minimum distance from the mounting face to the first light emitting element; and
the optical member is configured to reflect a portion of the light emitted from the first light emitting element downwards.

* * * * *